(12) United States Patent
Shastri

(10) Patent No.: US 6,552,619 B2
(45) Date of Patent: Apr. 22, 2003

(54) MULTI-CHANNEL CLOCK RECOVERY CIRCUIT

(75) Inventor: Kal Shastri, Orefield, PA (US)

(73) Assignee: PMC Sierra, Inc., British Columbia (CA)

(*) Notice: Subject to any disclaimer, the term of this patent is extended or adjusted under 35 U.S.C. 154(b) by 0 days.

(21) Appl. No.: 09/775,811

(22) Filed: Feb. 5, 2001

(65) Prior Publication Data

US 2002/0105386 A1 Aug. 8, 2002

(51) Int. Cl.$^7$ .................. H03L 7/085; H03L 7/093; H03L 7/099
(52) U.S. Cl. .................. 331/25; 331/1 A; 331/17; 331/57; 327/156; 327/159; 375/376
(58) Field of Search .................. 331/1 A, 10–12, 331/17, 25, 57; 327/147–150, 156–159; 375/376

(56) References Cited

U.S. PATENT DOCUMENTS

| | | | |
|---|---|---|---|
| 4,355,398 A | 10/1982 | Cook | 375/110 |
| 4,821,297 A | 4/1989 | Bergmann et al. | 375/120 |
| 5,027,085 A | 6/1991 | De Vito | 331/1 A |
| 5,237,290 A | 8/1993 | Banu et al. | 331/2 |
| 5,247,544 A * | 9/1993 | LaRosa et al. | 375/118 |
| 5,396,523 A * | 3/1995 | Hedberg | 375/373 |
| 5,590,140 A | 12/1996 | Bergmann | 371/61 |
| 5,717,728 A | 2/1998 | Hein et al. | 375/355 |
| 5,757,872 A | 5/1998 | Banu et al. | 375/372 |
| 5,761,255 A | 6/1998 | Shi | 375/360 |
| 5,812,619 A | 9/1998 | Runaldue | 375/376 |
| 5,987,085 A | 11/1999 | Anderson | 375/374 |
| 6,002,279 A | 12/1999 | Evans et al. | 327/144 |
| 6,035,409 A | 3/2000 | Gaudet | 713/401 |
| 6,263,034 B1 * | 7/2001 | Kanack et al. | 375/371 |
| 6,266,799 B1 * | 7/2001 | Lee et al. | 716/6 |
| 2002/0006177 A1 * | 1/2002 | Pickering et al. | |

* cited by examiner

Primary Examiner—David Mis
(74) Attorney, Agent, or Firm—Morgan, Lewis & Bockius LLP

(57) ABSTRACT

A multi-channel clock recovery circuit is provided that generates pairs of recovered half-speed clocks. Each pair of half-speed clocks has a relative phase relationship of 180° and are capable of registering input data of a data channel at the eye of the input data. The multi-phase clock recovery circuit includes a voltage controlled oscillator outputting a plurality of half-speed reference clocks. Each of a plurality of clock recovery circuits include a phase locked loop having a phase multiplexor, the phase multiplexor receiving the plurality of half-speed reference clocks and selectively outputting four recovered half-speed clocks each having a half-speed frequency relative to the input data. The four recovered clocks are used as a feedback reference clocks in the phase locked loop and two of the four recovered half-speed clocks are used to synchronize input data.

20 Claims, 32 Drawing Sheets

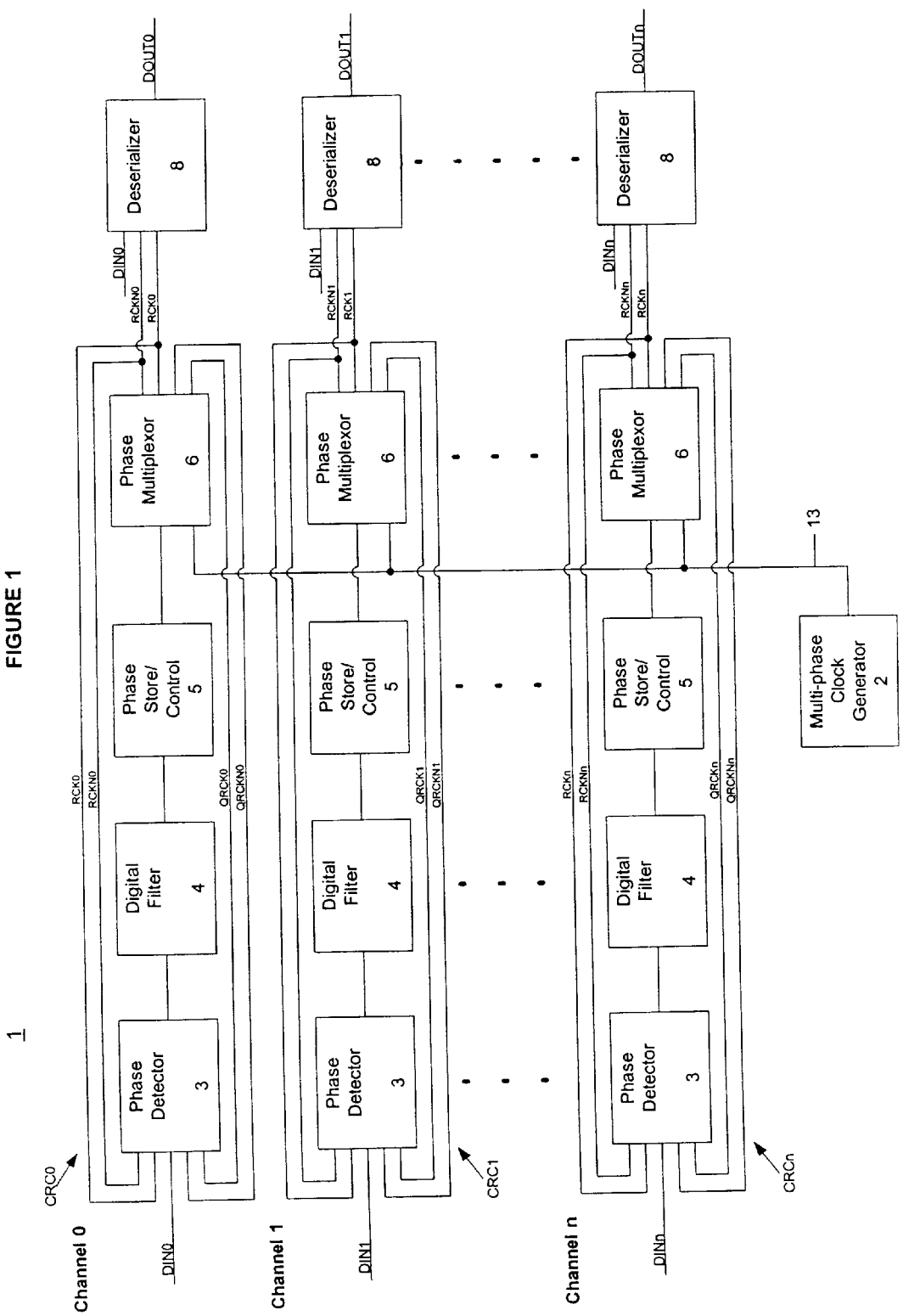

16 Phases of Half-Speed Clocks over Full Half Speed Clock Cycle T

Figure 9

| E2 | E1 | E0 | Action | E2 | E1 | E0 | Action | E4 | E3 | E2 | Action | E4 | E3 | E2 | Action | Comments |
|---|---|---|---|---|---|---|---|---|---|---|---|---|---|---|---|---|
| 0 | 0 | 0 | N/A | 1 | 0 | 0 | U1 | 0 | 0 | 0 | N/A | 1 | 1 | 0 | U2 | Input analyzed over two bits at a time using RCK |
| 0 | 0 | 1 | D1 | 1 | 0 | 1 | U1 | 0 | 0 | 1 | D2 | 1 | 1 | 1 | U2 | |
| 0 | 1 | 0 | U1 | 1 | 1 | 0 | D1 | 0 | 1 | 1 | U2 | 1 | 0 | 1 | D2 | |
| 0 | 1 | 1 | U1 | 1 | 1 | 1 | N/A | 1 | 0 | 0 | U2 | 1 | 1 | 1 | N/A | |

Figure 10

| U1 | D1 | U2 | D2 | DOWN1N | DOWN2N | UP1N | UP2N | COMMENTS |
|---|---|---|---|---|---|---|---|---|
| 0 | 0 | 0 | 0 | 1 | 1 | 1 | 1 | No Transitions Observed |
| 0 | 1 | 0 | 0 | 0 | 1 | 1 | 1 | 1 Tr indicating Ph Down |
| 1 | 0 | 0 | 0 | 1 | 1 | 0 | 1 | 1 Tr indicating Ph Up |
| 0 | 0 | 0 | 1 | 1 | 0 | 1 | 1 | 1 Tr indicating Ph Down |
| 0 | 0 | 1 | 0 | 1 | 1 | 1 | 0 | 1 Tr indicating Ph Up |
| 0 | 1 | 0 | 1 | 0 | 0 | 1 | 1 | 2 Tr, Both Indicating Ph Down |
| 1 | 0 | 0 | 1 | 1 | 0 | 0 | 1 | 2 Tr, One Ph up & One Ph Down |
| 0 | 1 | 1 | 0 | 0 | 1 | 1 | 0 | 1 Tr indicating Ph Up |
| 1 | 0 | 1 | 0 | 1 | 1 | 0 | 0 | 2 Tr, One Ph up & One Ph Down |
| 1 | 0 | 0 | 1 | 1 | 0 | 0 | 0 | 2 Tr, Both Indicating Ph Up |

From the Transition edges E[4:0] observed over two bit periods; analyze and decide how many net transitions (2 or 1 or 0) suggesting upward or downward move.

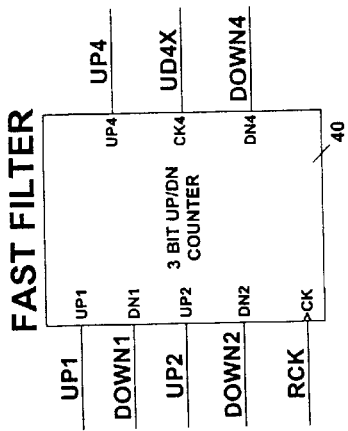
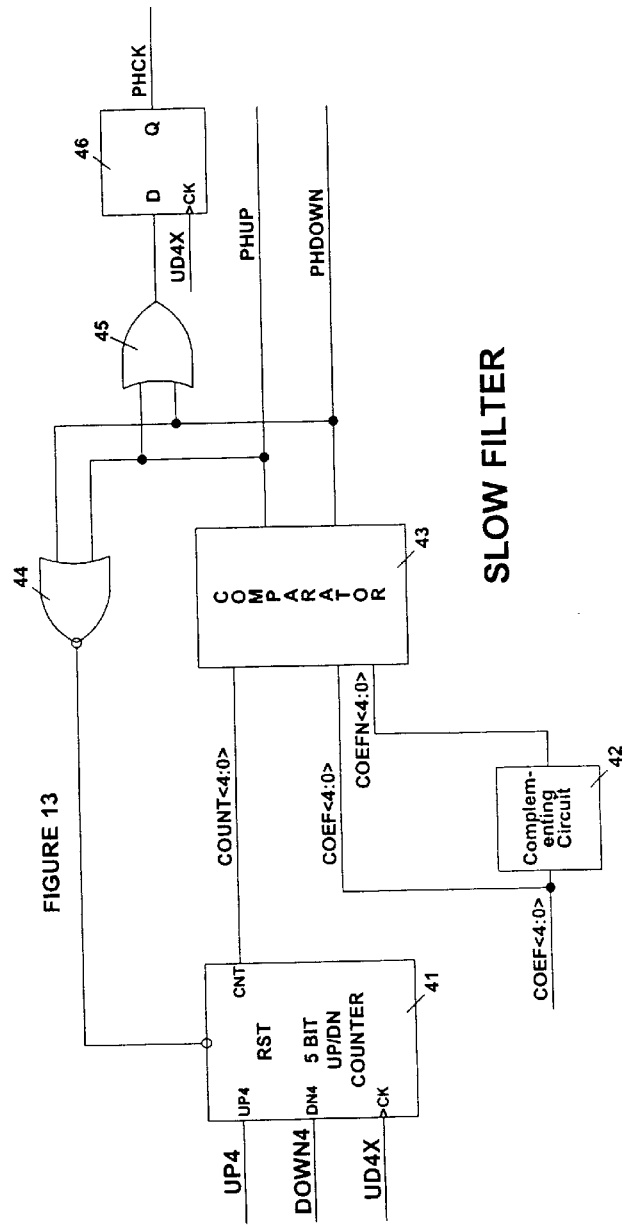

Figure 12

3-Bit Arithmetic with Zero @ 100. When Overflow, UP4 = 1 & When Underflow, DOWN4 = 1
000 NOT ALLOWED

| B2 | B1 | B0 | B = A + 1, UP1N = 0 | | | | B = A + 2, UP2N = 0 | | | | B = A − 1, DOWN1N = 0 | | | | B = A − 2, DOWN2N = 0 | | | |
|---|---|---|---|---|---|---|---|---|---|---|---|---|---|---|---|---|---|---|
| | | | A2 | A1 | A0 | UP4 | A2 | A1 | A0 | UP4 | A2 | A1 | A0 | DOWN4 | A2 | A1 | A0 | DOWN4 |
| 0 | 0 | 0 | 0 | 0 | 1 | 0 | 0 | 1 | 0 | 0 | 1 | 1 | 1 | 1 | 0 | 0 | 1 | 1 |
| 0 | 0 | 1 | 0 | 1 | 0 | 0 | 0 | 1 | 1 | 0 | 1 | 0 | 0 | 0 | 0 | 1 | 1 | 1 |
| 0 | 1 | 0 | 0 | 1 | 1 | 0 | 1 | 0 | 0 | 0 | 0 | 0 | 1 | 0 | 1 | 0 | 0 | 0 |
| 0 | 1 | 1 | 1 | 0 | 0 | 0 | 1 | 0 | 1 | 0 | 0 | 1 | 0 | 0 | 0 | 0 | 1 | 0 |
| 1 | 0 | 0 | 1 | 0 | 1 | 0 | 1 | 1 | 0 | 0 | 0 | 1 | 1 | 0 | 0 | 1 | 0 | 0 |
| 1 | 0 | 1 | 1 | 1 | 0 | 0 | 1 | 1 | 1 | 0 | 1 | 0 | 0 | 0 | 1 | 0 | 0 | 0 |
| 1 | 1 | 0 | 1 | 1 | 1 | 0 | 0 | 0 | 1 | 1 | 1 | 0 | 1 | 0 | 0 | 0 | 1 | 1 |
| 1 | 1 | 1 | 0 | 0 | 1 | 1 | 0 | 1 | 0 | 1 | 1 | 1 | 0 | 0 | 1 | 0 | 1 | 0 |

A = Current Count
B = Next Count

Figure 15

| 4:1 Muxes – 1st Stage of Selecting RCK & QRCK Controlled by G[1:0] | | | | | | | | | |
|---|---|---|---|---|---|---|---|---|---|
| G1 | G0 | S10 | S11 | S01 | S00 | U10 | U11 | U01 | U00 |
| 0 | 0 | 0 | 0 | 0 | 1 | 15 | 8 | 7 | 0 |
| 0 | 1 | 0 | 0 | 1 | 0 | 14 | 9 | 6 | 1 |
| 1 | 1 | 0 | 1 | 0 | 0 | 13 | 10 | 5 | 2 |
| 1 | 0 | 1 | 0 | 0 | 0 | 12 | 11 | 4 | 3 |

Figure 16

| 4:2 MUXE – 2nd Stage of Selecting RCK & QRCK Controlled by G[3:2] | | | | | | Corresponding Selected Signals/Phases | |
|---|---|---|---|---|---|---|---|
| G3 | G2 | SU10 | SU11 | SU01 | SU00 | RCK | QRCK |
| 0 | 0 | 0 | 0 | 0 | 1 | U00 = 0,1,2,3 | U11 = 8,9,10,11 |
| 0 | 1 | 0 | 0 | 1 | 0 | U01 = 7,6,5,4 | U10 = 15,14,13,12 |
| 1 | 1 | 0 | 1 | 0 | 0 | U11 = 8,9,10,11 | U00 = 0,1,2,3 |
| 1 | 0 | 1 | 0 | 0 | 0 | U10 = 15,14,13,12 | U01 = 7,6,5,4 |

Figure 17

| Gray Code G[4:0] Selects Phase | | | | | RCK | QRCK |
|---|---|---|---|---|---|---|
| G4 | G3 | G2 | G1 | G0 | | |
| 0 | 0 | 0 | 0 | 0 | 0 | 8 |
| 0 | 0 | 0 | 0 | 1 | 1 | 9 |
| 0 | 0 | 0 | 1 | 1 | 2 | 10 |
| 0 | 0 | 0 | 1 | 0 | 3 | 11 |
| 0 | 0 | 1 | 1 | 0 | 4 | 12 |
| 0 | 0 | 1 | 1 | 1 | 5 | 13 |
| 0 | 0 | 1 | 0 | 1 | 6 | 14 |
| 0 | 0 | 1 | 0 | 0 | 7 | 15 |
| 0 | 1 | 1 | 0 | 0 | 8 | 0n |
| 0 | 1 | 1 | 0 | 1 | 9 | 1n |
| 0 | 1 | 1 | 1 | 1 | 10 | 2n |
| 0 | 1 | 1 | 1 | 0 | 11 | 3n |
| 0 | 1 | 0 | 1 | 0 | 12 | 4n |
| 0 | 1 | 0 | 1 | 1 | 13 | 5n |
| 0 | 1 | 0 | 0 | 1 | 14 | 6n |
| 0 | 1 | 0 | 0 | 0 | 15 | 7n |

Figure 18

| Gray Code G[4:0] Selects Phase | | | | | RCK | QRCK |
|---|---|---|---|---|---|---|
| G4 | G3 | G2 | G1 | G0 | | |
| 1 | 1 | 0 | 0 | 0 | 0n | 8n |
| 1 | 1 | 0 | 0 | 1 | 1n | 9n |
| 1 | 1 | 0 | 1 | 1 | 2n | 10n |
| 1 | 1 | 0 | 1 | 0 | 3n | 11n |
| 1 | 1 | 1 | 1 | 0 | 4n | 12n |
| 1 | 1 | 1 | 1 | 1 | 5n | 13n |
| 1 | 1 | 1 | 0 | 1 | 6n | 14n |
| 1 | 1 | 1 | 0 | 0 | 7n | 15n |
| 1 | 0 | 1 | 0 | 0 | 8n | 0 |
| 1 | 0 | 1 | 0 | 1 | 9n | 1 |
| 1 | 0 | 1 | 1 | 1 | 10n | 2 |
| 1 | 0 | 1 | 1 | 0 | 11n | 3 |
| 1 | 0 | 0 | 1 | 0 | 12n | 4 |
| 1 | 0 | 0 | 1 | 1 | 13n | 5 |
| 1 | 0 | 0 | 0 | 1 | 14n | 6 |
| 1 | 0 | 0 | 0 | 0 | 15n | 7 |

AND GATE WITH
DELAYED FALL TIME

INVERTING PHASE MULTIPLEXOR

16:4 PHMUX

PHMUX

8:4 DUMUX

DUMUX

Operation of Make-Before-Break Circuit

16:8 PMUX

FIGURE 33   DUMUX

Figure 34

| S00/S00N | S01/S01N | S11/S11N | S10/S10N | OUT00N | OUT01N | OUTX |
|---|---|---|---|---|---|---|
| 0/1 | 0/1 | 0/1 | 1/0 | 11/I3 | I5 | disabled |
| 0/1 | 0/1 | 1/0 | 0/1 | I3 | I3/I5 | disabled |
| 0/1 | 1/0 | 0/1 | 0/1 | I1 | I7 | disabled |
| 1/0 | 0/1 | 0/1 | 0/1 | I1 | I7 | I7 |

Figure 35

| SU00/SU00N | SU01/SU01N | SU11/SU11N | SU10/SU10N | SHCK0 | QSHCK0 | SHCK1 | QSHCK1 | SHCK0N | QSHCK0N | SHCK1N | QSHCK1N |
|---|---|---|---|---|---|---|---|---|---|---|---|
| 0/1 | 0/1 | 0/1 | 1/0 | DU00 | DU11 | DU10 | DU01 | DU00N | DU11N | DU10 | DU10N |
| 0/1 | 0/1 | 1/0 | 0/1 | DU01 | DU10 | DU11 | DU00 | DU01N | DU10N | DU11 | DU00N |
| 0/1 | 1/0 | 0/1 | 0/1 | DU11 | DU00N | DU01N | DU10N | DU11N | DU00 | DU01 | DU10 |
| 1/0 | 0/1 | 0/1 | 0/1 | DU10 | DU01N | DU00N | DU11N | DU10N | DU01 | DU00 | DU11 |

Figure 36

Example of How Clocks are Selected Using Interpolating Phase Multiplexor [G = 00000] => S00=0, SU00=0, and G=0]

MULTI-CHANNEL CLOCK RECOVERY CIRCUIT

BACKGROUND OF THE INVENTION

1. Field of Invention

This invention relates to a clock recovery circuit, and in particular, to a multi-channel clock recovery circuit where multiple channels use a common voltage controlled oscillator (VCO).

2. Discussion of Related Art

As data traffic increases, for example, through use of the Internet, there has developed a need for high-speed, high-bandwidth communications equipment. Consequently, there is also a demand for integrated circuits for use in that equipment. Because of the speed and density of such integrated circuits, it is important that the circuits are designed to operate at low power. One type of integrated circuit is a clock recovery circuit used in serial data transmission.

In digital communications systems, it is often desirable to transmit serially digital data between remote sites. In serial communication, a single optical fiber or wire (for example, coaxial or twisted-pair) carries a serial stream of data bits, often at data rates of 1.25 Ghz or greater. This method also requires that the serial data be accompanied by a synchronous clock so that a digital receiver is able to properly register the incoming serial data. In other words, the synchronous clock informs the receiver of when each serial data bit has arrived.

However, it is often difficult or impractical to transmit a synchronous clock along with the serial data. Fortunately, the clock data needed by a remote receiver to register the serial bit stream is often encoded within the serial data. The circuitry by which the clock data is recovered from the data stream is called a clock recovery circuit. The clock recovery circuit extracts information contained within the serial data bit stream to generate a clock that is synchronous with the serial data bit stream. For example, the clock recovery circuit can inspect the serial data transitions to determine the frequency and phase of the incoming serial bit stream.

A typical clock recovery circuit is shown in FIG. 38. The clock recovery circuit is arranged in a phase locked loop configuration and includes a phase detector 200 and a voltage controlled oscillator (VCO) 201. The VCO 201 generates even and odd half-speed output clocks CLKEVEN and CLKODD having a relative phase difference of 180°. The term "half-speed clock" refers to a clock having a frequency of half the data rate of the received data. As configured, the even input data of DIN is registered with the rising edges of CLKEVEN and the odd input data is registered with the rising edge of CLKODD. In this manner, two clocks operating at half-speed can be used to synchronize corresponding input data. This arrangement is valuable because slower reference clocks require lower power and are easier to generate and control. Further, slower clocks have more favorable waveforms and are less susceptible to noise.

VCO 201 also generates a fall-speed feedback reference clock at approximately the same frequency as the input data rate of DIN. The frequency and phases of CLKEVEN, CLKODD, and the feedback reference clock are controlled by the input voltage Vin of the VCO 201. If the voltage supplied to the input of the VCO 201 increases, the frequency and phase of the output clocks CLKEVEN, CLKODD, and the feedback reference clock increases, and if the voltage to the input of the VCO decreases, the frequency and phase of the output clocks CLKEVEN, CLKODD, and the feedback reference clock decreases.

The phase detector 200 analyzes the input data DIN over one bit period and determines whether the feedback reference clock leads or lags the input data DIN. If the feedback reference clock lags the phase of the input data DIN, the phase detector 200 increases the voltage at the input of VCO 201 thereby causing VCO 201 to increase the phase/frequency of the feedback reference clock, CLKEVEN, and CLKODD. If the feedback reference clock leads the phase of the input data DIN, the phase detector 200 decreases the voltage at the VCO 201 input thereby causing the VCO 201 to decrease the phase/frequency of the feedback reference clock, CLKEVEN, and CLKODD. Thus, the feedback reference clock and even/odd clocks (CLKEVEN/CLKODD) tend to synchronize with the phase and frequency of the input data DIN in a closed loop fashion.

FIG. 39 shows a typical waveform of input serial data DIN at high frequency. The input data "eye" pattern is the superposition of the input data trace as a function of time over one bit period. In functional language, EYE=Input Data (t+nT), where t is less than or equal to T. Because the serial input data DIN is being received at such a high frequency (e.g., 1.25 GHz), and over various non-linear medium, the serial data is likely to be significantly distorted in amplitude and phase. As can be seen, sampling the input data near the transition of the input data eye could easily lead to an error due to the distorted waveform of high speed data stream DIN. In other words, the value of the input data DIN, measured near the transition points (high-to-low or low-to-high), could mistakenly be recorded as a "1" when it is properly a "0" or a "0" when it is properly a "1". As shown, a sampling point where there is the highest probability that the data will be sampled correctly is half-way between the transition points of the input data DIN. This point is referred to as the middle of the "eye" of the input data. Therefore, it is important to synchronize CLKEVEN and CLKODD so that their registering clock edges occur as close as possible to the middle of the "eye" of the even and odd data, respectively.

A practical data communication system often contains multiple channels of serial data streams. This necessitates duplication of the clock recovery circuit for each channel. However, the power consumption becomes prohibitively high when implementing multiple VCOs on a semiconductor die. To reduce power consumption, it is therefore desirable to employ a common VCO for all of the clock recovery circuits. However, when multiple channels of serial input data are received, the input data in each channel may vary slightly in frequency and significantly in phase with respect to the input data in one or more of the other channels. Therefore, the same VCO can not be used for each PLL in conventional multi-channel clock recovery circuits. Accordingly, there is a need for a multi-channel clock recovery circuit that is capable of using of a common VCO to drive multiple clock recovery circuits for multiple channels.

SUMMARY OF THE PRESENT INVENTION

An object of the invention is to overcome the aforementioned problems and limitations of conventional clock recovery circuits. Another object is to provide a multi-channel clock recovery circuit that uses a single VCO. Another object is to provide a multi-channel clock recovery circuit that operates at low power. Another object is to provide an efficient inverting phase multiplexor that selects clock phases from a clock generator without causing glitches in the clock. Another object is to provide an efficient interpolating phase multiplexor that selects clock phases without causing glitches in the clock. Another object is to provide a multi-channel clock recovery circuit having a two stage filter. Another object is to provide a multi-channel clock recovery circuit using a single VCO with a plurality of output clocks on a phase bus, where the clock recovery circuit has a layout that minimizes the length of the phase bus.

To achieve these and other advantages and in accordance with the purpose of the present invention, as embodied and broadly described, in one aspect of the invention there is provided a multiple (or single) channel digital clock recovery circuit for generating and using quadrature clocks operating at half the speed of the incoming data rate of each channel, wherein a pair of the half speed quadrature clocks have an inverse phase relationship and are capable of registering input data of a channel at the center of the input data eye. The other pair of the half speed quadrature clocks have an inverse phase relationship and are 90 and 270 degrees away from the first pair, respectively, and are in the middle of the transition region of the input data eye respectively.

The quadrature phases of the half speed clocks span two input data eyes and in a given cycle there could be as many as two transitions of the input data. The position where each of the data transitions occur relative to the four phases of the quadrature clocks are analyzed using a digital phase detector and implementing the following algorithm: the sum of transitions between quadrature phases 270 degrees & 0 degrees and 90 degrees & 180 degrees should be same as the sum of transitions between quadrature phases 0 degrees & 90 degrees and 180 degrees & 270 degrees. This condition provides feedback to a phase multiplexor circuit, which selects the four quadrature phases with the above relationship from a plurality of phases of half-speed clocks, generated by VCO of an analog PLL, to satisfy above described criteria. The decision of changing selected phases, based upon above criteria is filtered through a digitally programmable filter for desired performance for the above digital clock recovery circuit for each channel.

It is to be understood that both the foregoing general description and the following detailed description are exemplary and explanatory and are intended to provided further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a block diagram of a multi-channel clock recovery system of the present invention;

FIG. 9 is a logic table describing how the input data is analyzed;

FIG. 10 is a logic table showing how input data is analyzed over two bit periods;

FIG. 11 is a block diagram of the fast filter;

FIG. 12 is a table showing the current count A and next count B of the fast filter of FIG. 11;

FIG. 13 is a block diagram of the slow filter;

FIG. 15 is a table showing the control signal logic for controlling a first stage of the phase multiplexor;

FIG. 16 is a table showing the control signal logic for controlling a second stage of the phase multiplexor;

FIGS. 17 and 18 are tables showing the relationship between the gray codes and the phase selection from the inverting phase multiplexor;

FIG. 34 is a table showing the PMUX outputs as a function of the PMUX inputs;

FIG. 35 is a table showing the DMUX outputs as a function of the DMUX inputs;

FIG. 36 is table showing the control signals and clock selection of the interpolating phase multiplexor as a function of the gray codes;

DESCRIPTION OF THE PREFERRED EMBODIMENT

Figure 3:
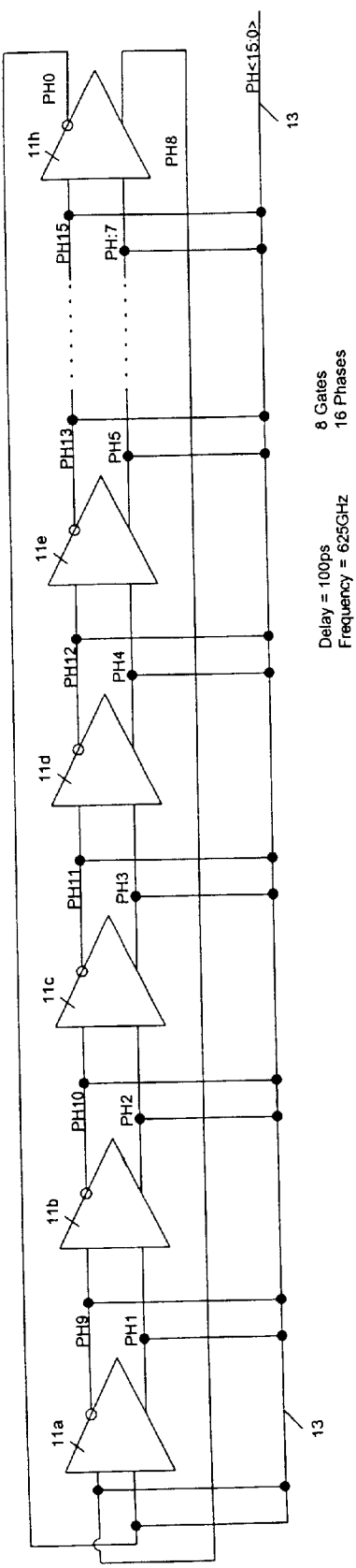
FIG. 3 is a clock generator for generating 16 phases of a reference clock equally spaced within one clock cycle of a reference clock cycle period T.

FIG. 1 shows a multi-channel clock recovery circuit 1 of the present invention. Multi-channel clock recovery circuit 1 includes a plurality of clock recovery circuits CRC0–CRCn. Each of the plurality of clock recovery circuits CRC0–CRCn receive a corresponding data input DIN0–DINn from corresponding channels (0–n). Further, each CRC (0–n) provides a pair of even/odd half-speed clock signals RCK and RCKN to a corresponding de-serializer circuit 8. Each of the plurality of clock recovery circuits CRC0–CRCn are driven by a multi-phase clock generator 2. The de-serializer 8 uses the even/odd half-speed clocks RCK (0–n) and RCKN (0–n) to register the input data DIN0–DINn from the multiple channels and convert the input data DIN0–DINn into parallel data DOUT0–DOUTn. It is important to note that the even/odd half-speed clocks are not limited to use in a de-serializer, but may be employed to synchronize data in a wide variety of circuitry.

The clock recovery circuits each include a phase detector 3, digital filter 4, phase store/control 5, and a phase multiplexor 6. Phase detector 3 receives the input data DIN and reference clocks RCK, RCKN, QRCK, and QRCKN. Phase detector 3 provides an error output to the input of the digital filter 4. Digital filter 4 provides a filtered error output to the input of phase store/control 5. The phase store/control 5 provides phase select output signals to the phase multiplexor 6. Additionally, clock generator 2 provides 16 half-speed reference clocks to the phase multiplexor 6. Based on the phase select output signals, the phase multiplexor 6 selects and/or generates reference clocks RCK, RCKN, QRCK, and QRCKN used by the phase detector 3. The de-serializer 8 also uses reference clocks RCK and RCKN to synchronize input data DIN.

Multi-Phase Clock Generator

Figure 2:
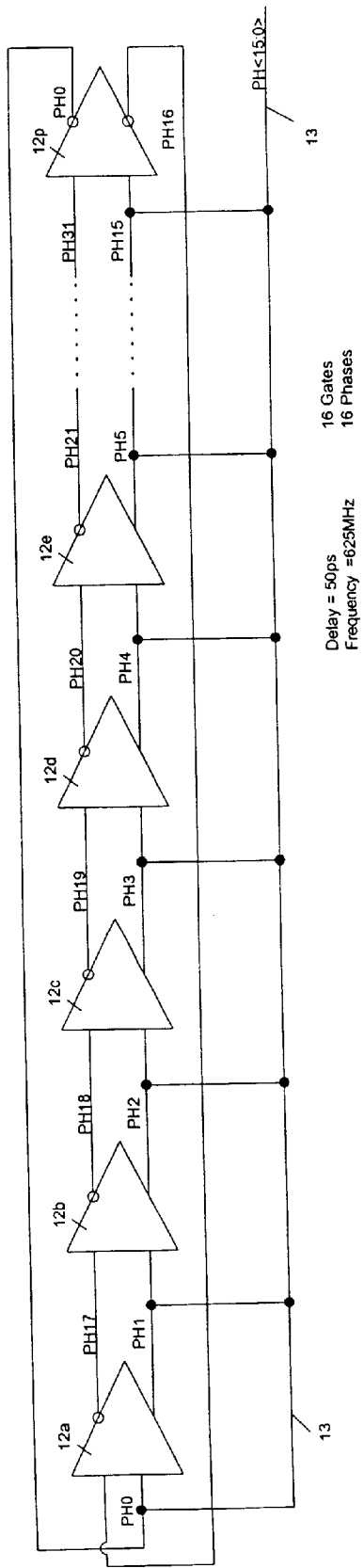
FIG. 2 is a clock generator for generating 16 phases of a reference clock equally spaced within one half of a reference clock cycle period T.

FIG. 2 illustrates a ring-type implementation of the multi-phase clock generator 2. The multi-phase clock generator 2 includes 16 differential amplifiers 12a–12p. The 16 differential amplifiers 12a–12p are connected in a ring with the complemented output of each differential amplifier driving one of the differential inputs of the next adjacent differential amplifier, and the non-inverting output of the differential amplifier driving the other differential input of the next adjacent differential amplifier. Each differential amplifier has a propagation delay of 50 ps. As a result, the feedback loop generates clocks having a period T of (2)×(Number of differential amplifiers)×(propagation delay)=(2)×(16)×(50×10(−9))=1600 ps. The resulting frequency is 1/1600 ps 625 MHz.

Figure 4:
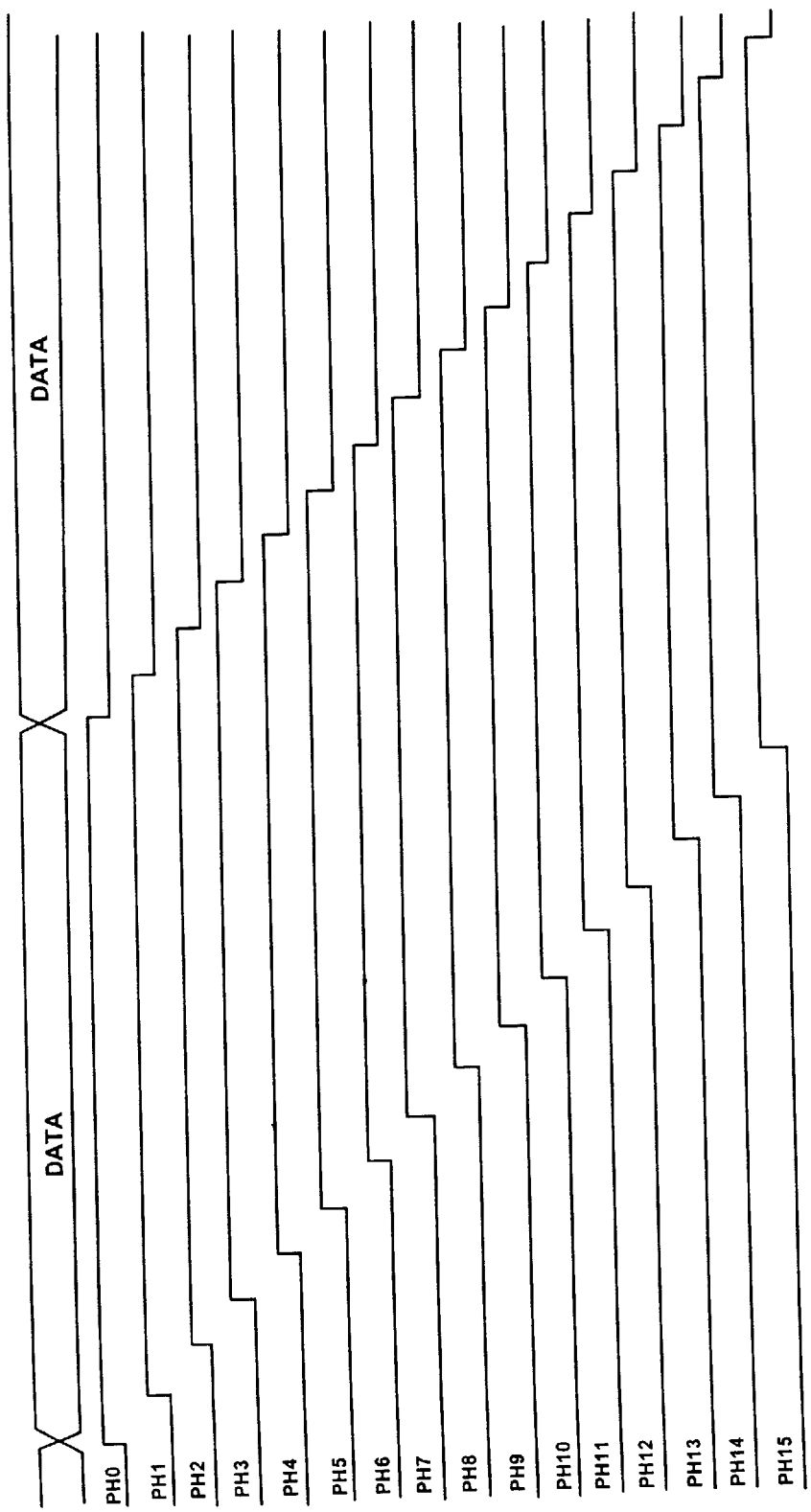
FIG. 4 is a timing diagram showing the output of the clock generator of FIG. 2.

As shown in the timing diagram of FIG. 4, the multi-phase clock generator 2 is tapped at the non-inverting outputs of the differential amplifiers 12a–12p to generate 16 half-speed clocks PH0–PH15 having equally spaced phases over one half of a half speed clock cycle period T. Clocks PH0–PH15 are present on phase bus 13 which distributes the clocks to the multiple clock recovery circuits CRC0–CRCn. The remaining 16 clock signals having phases in the other half of the cycle period T (i.e., PH17–PH31) can be found at the un-tapped inverting outputs of the differential amplifiers 12a–12p.

Phase Detector

FIGS. 6–10 illustrate the phase detector 3. Input data DIN is coupled to the input of four delay lines. The first delay line includes D-type flip-flops 13a–13h arranged in series with the Qn output of each D-type flop-flop coupled to the D-input of an adjacent successive D-type flip-flop. The first D-type flip-flop 13a in the first delay line registers DIN with the rising edge of RCKN. The second D-type flip-flop 13b in the first delay line registers DIN with the rising edge of RCK. As shown, D-type flip-flops 13a–13h alternatingly register data with the rising edge of RCKN and RCK.

The second delay line includes D-type flip-flops 14a–14g arranged in series with the Qn output of each D-type flop-flop coupled to the D-input of an adjacent successive D-type flip-flop. The first D-type flip-flop 14a in the second delay line registers DIN with the rising edge of RCK. The second D-type flip-flop 14b in the second delay line registers DIN with the rising edge of RCKN. As shown, flip-flops 14a–14g alternatingly register data with the rising edges of RCK and RCKN.

The third delay line includes D-type flip-flops 15a–15h arranged in series with the Qn output of each D-type flop-flop coupled to the D-input of an adjacent successive D-type flip-flop. The first D-type flip-flop 15a in the third delay line registers DIN with the rising edge of QRCKN. The second D-type flip-flop 15b in the third delay line registers DIN with the rising edge of QRCK. As shown, D-type flip-flops 15c–15f alternatingly register data with the rising edges of QRCKN and QRCK. At the end of the delay line, D-type flip-flop 15g is driven by RCKN and D-type flip-flop 15h is driven by RCK.

The fourth delay line includes D-type flip-flops 16a–16g arranged in series with the Qn output of D-type flop-flops coupled to the D-input of an adjacent successive D-type flip-flop. The first D-type flip-flop 16a in the fourth delay line registers DIN with the rising edge of QRCK. The second D-type flip-flop 16b in the fourth delay line registers DIN with the rising edge of QRCKN. As shown, D-type flip-flops 16a–16f alternatingly register data with the rising edges of QRCKN and QRCK. At the end of the delay line, D-type flip-flop 16g is driven by RCK. Further, as shown, invertors 17a–17j provide the proper polarity and delay of the tapped samples of each of the delay lines. Accordingly, data samples E0–E4 are output by the four delay lines of the phase detector.

Figure 7:
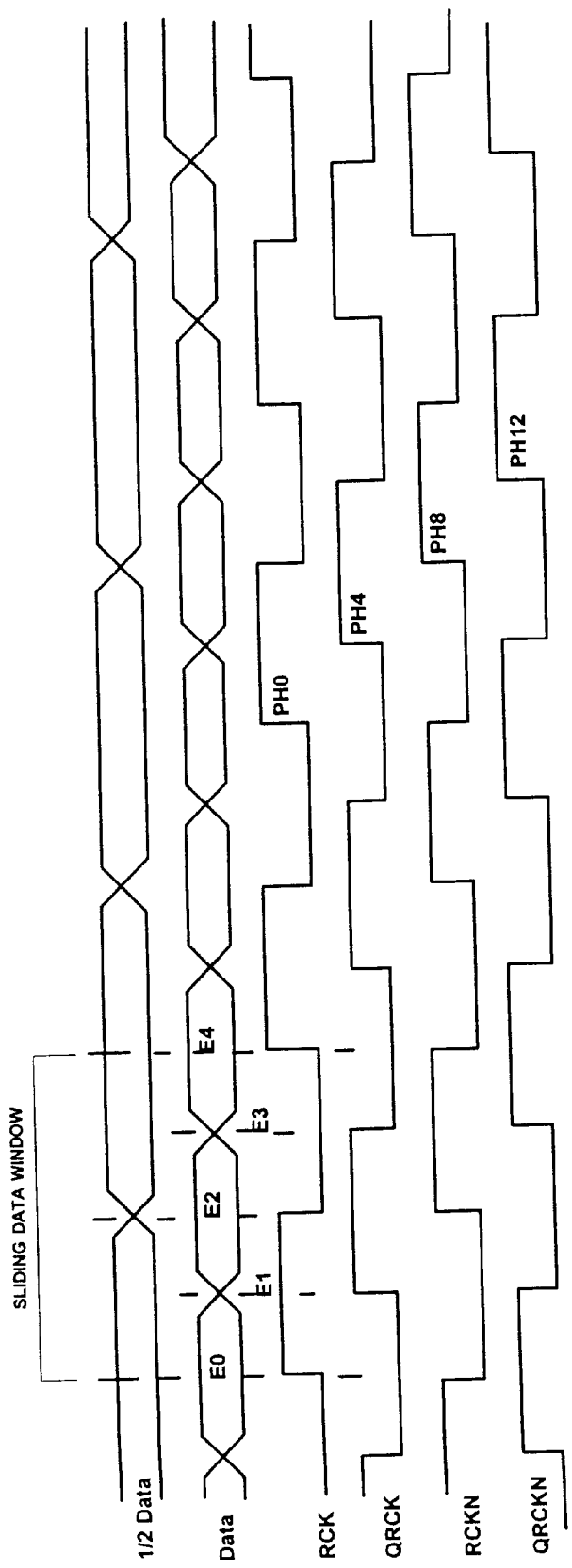
FIG. 7 is a timing diagram showing the input data relative to the half-speed reference clocks.

As shown in FIG. 7, the four half-speed clocks RCK, RCKN, QRCK, and QRCKN are used to sample input data at twice the frequency of the input data thereby extracting samples E0–E4. Also, as shown, a ½ data rate input data can be sampled at twice its data rate by use of only two of the half-speed clocks, e.g., RCK and RCKN.

Figure 8:
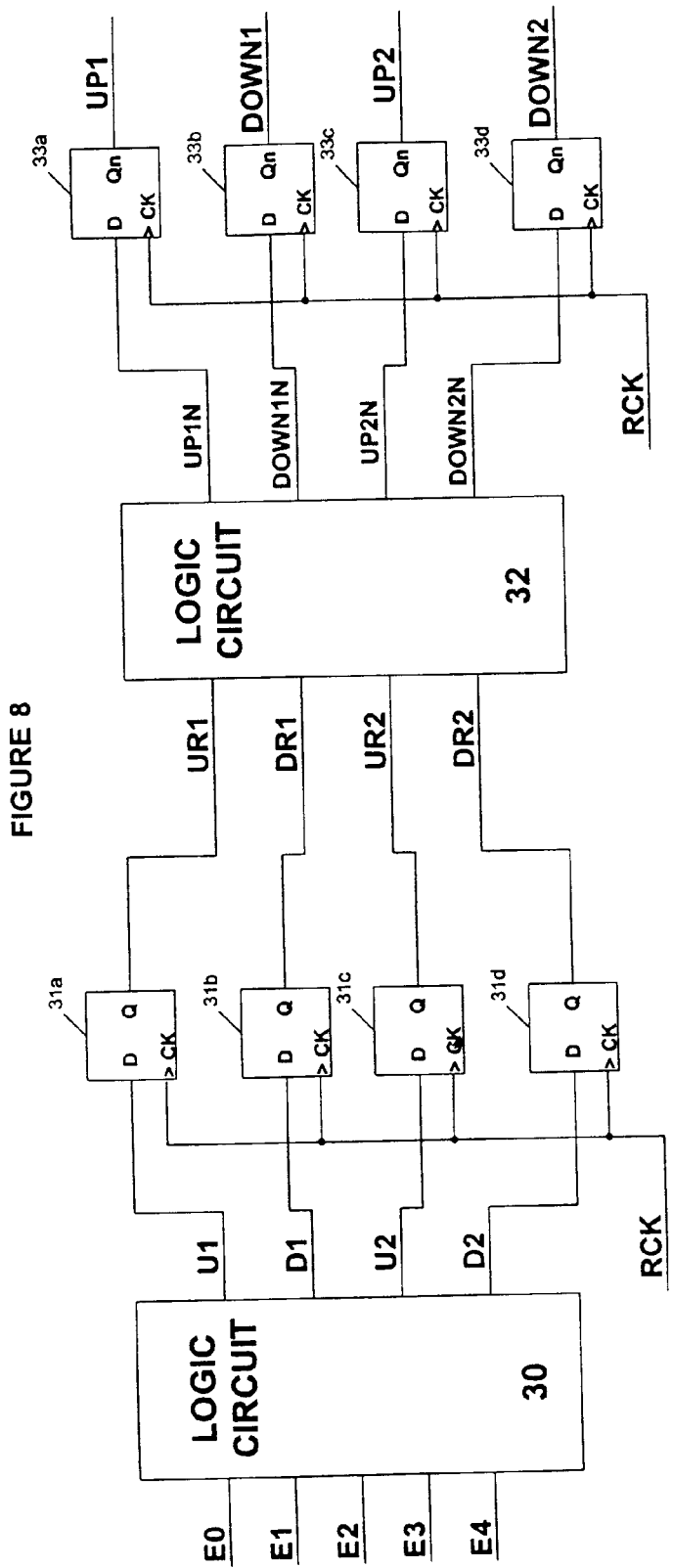
FIG. 8 is a block diagram of the error signal generator used in the phase detector of FIG. 1.

As shown in FIG. 8, phase detector 3 also includes a first logic circuit 30, a first set of registers 31a–31d, a second logic circuit 32, and a second set of registers 33a–33d. The first logic circuit 30 receives the five data samples E0–E4 and implements the logic table shown in FIG. 9. Accordingly, first logic circuit 30 generates output signals U1, D1, U2, and D2. The signals U1 and D1 are based upon an observation of the transition edges of E0–E2 and represent the leading or lagging position of the input data E0–E2 relative to RCK. The signals U2 and D2 are based upon an observation of the transition edges of E2–E4 and represent the leading or lagging position of the input data E0–E2 relative to RCKN.

Signals U1, D1, U2, D2 are synchronized with RCK to produce registered signals UR1, DR1, UR2, DR2, which are then received as inputs by the second logic circuit 32. The second logic circuit 32 implements the table in FIG. 10 to generate output signals UP1N, DOWN1N, UP2N, and DOWN2N. From the transition edges E0–E4 observed over two bit periods, the second logic circuit 32 determines the net transitions (2 or 1 or 0) suggesting an upward or downward shift of DIN relative to the half-speed reference clock RCK. Signals UP1N, DOWN1N, UP2N, and DOWN2N are synchronized with RCK via inverting registers 33a–33d to produce registered phase error signals UP1, DOWN1, UP2, and DOWN2.

2-Stage Digital Filter

FIGS. 11 and 13 show the digital filter 4. Digital filter 4 includes a fast digital filter 40 and a slow digital filter 47. Fast digital filter 4 can be implemented as a 3-bit wrap-around synchronous counter. The 3-bit counter has an internal current count A (A0, A1, and A2) which represents the current state of the counter and an internal next count B (B0, B1, and B2) which is defined by the current count A and the input control signals UP1, DOWN1, UP2, and DOWN2. The 3-bit counter increments by one when the UP1 input is asserted and decrements by one when the DOWN1 input is asserted. The 3-bit counter increments by two when the UP2 input is asserted and decrements by two when the DOWN2 input is asserted. All changes in count are synchronous with RCK.

As shown in the counter state table of FIG. 12, the count of A=100 binary represents a counter state of zero, the count of A=110 binary represents a counter state of "2", and the count of A=111 represents a counter state of "–2". Moreover, the inputs UP1, DOWN1, UP2, and DOWN2 cause the 3-bit counter to wrap around by the amount of the overflow or underflow. When an overflow occurs, logic in the fast filter 40 causes an UP4 signal to be generated along with a corresponding UD4X clock signal. When an underflow occurs, logic in the fast filter 40 causes a DOWN4 signal to be generated along with a corresponding UD4X clock signal.

FIG. 13 illustrates slow filter 47. Slow filter 47 includes a 5-bit UP/DOWN counter 41, 5 bit complement circuit 42, dual 5 bit comparator 43, and a NOR gate 44, OR gate 45, and D-type flip flop 46. The 5-bit UP/DOWN counter 41 receives inputs UP4, DOWN4, and UD4X from the fast filter 40. The assertion of input signal UP4 in conjunction with UD4X causes counter 41 to increment by one, and the assertion of input signal DOWN4 in conjunction with UD4X causes counter 41 to decrement by one. The output of counter 41 (COUNT<4:0>) is coupled to the dual comparator 43. Further, a coefficient COEF<4:0> is coupled to the input of comparator 43 and the input of complementing circuit 42. The coefficient COEF<4:0> represents the maximum positive count of the counter 41. The complementing circuit 42 complements the COEF<4:0> and couples the complement of COEF<4:0> (COEFN<4:0>) to the input of the dual comparator 43. The coefficient COEFN<4:0> represents the maximum negative count of the counter 41.

Comparator 43 compares COUNT<4:0> to coefficient COEF<4:0>. When COUNT<4:0> equals COEF<4:0>, the comparator generates an output signal PHUP which indicates an overflow. Comparator 43 also compares COUNT<4:0> to a COEFN<4:0>. When COUNT<4:0> equals COEFN<4:0>, the comparator generates an output signal PHDOWN which indicates an underflow. Signals PHUP and PHDOWN are coupled to the input of NOR gate 44 which generates a reset signal which is received by counter 41. Thus, wherever an underflow or an overflow is generated by comparator 43, counter 41 is reset to an initial state halfway between COEF<4:0> and COEFN<4:0>.

Additionally, OR gate 45 and D-type flip-flop 46 generate a PHCK signal coincident with each occurrence of PHUP or PHDOWN.

Phase Store and Control Signal Generation

Figure 14:
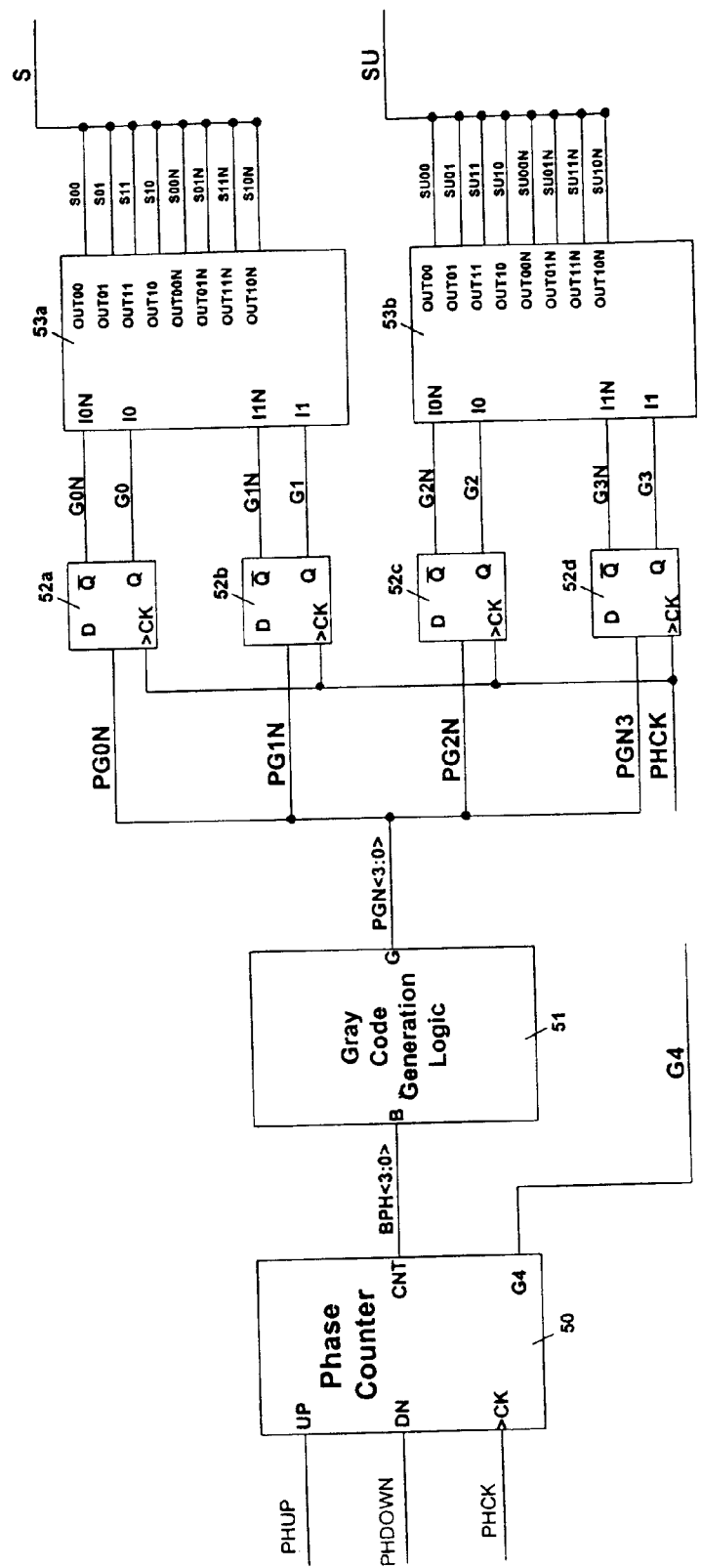
FIG. 14 is a block diagram of the phase counter, gray code generator, and control signal logic of the phase store shown in FIG. 1.

FIG. 14 illustrates the phase store/control 5. Phase store/control 5 includes a phase counter 50, gray code generation logic 51, gray code registers 52a–52d, and control signal generation logic 53a and 53b. The phase counter 50 is a 5-bit up/down counter controlled by input signals PHUP, PHDOWN, and PHCK. The phase counter 50 is incremented by one when PHUP is asserted in conjunction with the PHCK. The phase counter 50 is decremented by one when PHDOWN is asserted in conjunction with the PHCK. The phase counter 50 generates a 5 bit output including BPH<3:0>, representing the 4 least significant bits (1sb's) of the selected phase, and G4, which represents the most significant bit (msb) of the selected phase. BPG<3:0> are received by gray code generation logic 51 which converts the 4 bit binary phase code BPH<3:0> into a 4 bit gray code output PGN<3:0>. Gray code output PGN<3:0> has the unique property that only one bit of the total of 4 bits undergoes a transition for every increment or decrement of the binary phase count BPG<3:0>. PGN<3:0> is synchronized with the rising edge of the PHCK signal by registers 52a–52d. The Qn outputs of registers 52a–52d are used to generate a complement of PGN<3:0>. Accordingly, signals G0N/G0, G1N/G1, G2N/G2, and G3N/G3 are generated, respectively, by registers 52a–52d. Control signal generation logic 53a/53b converts the registered gray code G0–G3, and complements of the gray code (G0N–G3N), into phase multiplexor control signals S and SU.

Control signal generation logic 53a/53b generate S signals (S00/S00N, S01/S01N, S11/S11N, and S10/S10N) and SU signals (SU00/SU00N, SU01/SU01N, SU11/SU11N, and SU10/SU10N), respectively. Accordingly, a total of 16 control signals including S, SU, and a select signal G4 are received by the phase multiplexor 6 to provide for selection and/or generation of any four of the 32 possible phases of clocks derived from the multi-phase clock generator 2. The conversion logic for 53a/53b is shown in the tables of FIGS. 15 and 16. Further, FIGS. 17 and 18 show the phase selection as a function of the gray code G0–G4.

Figure 19:
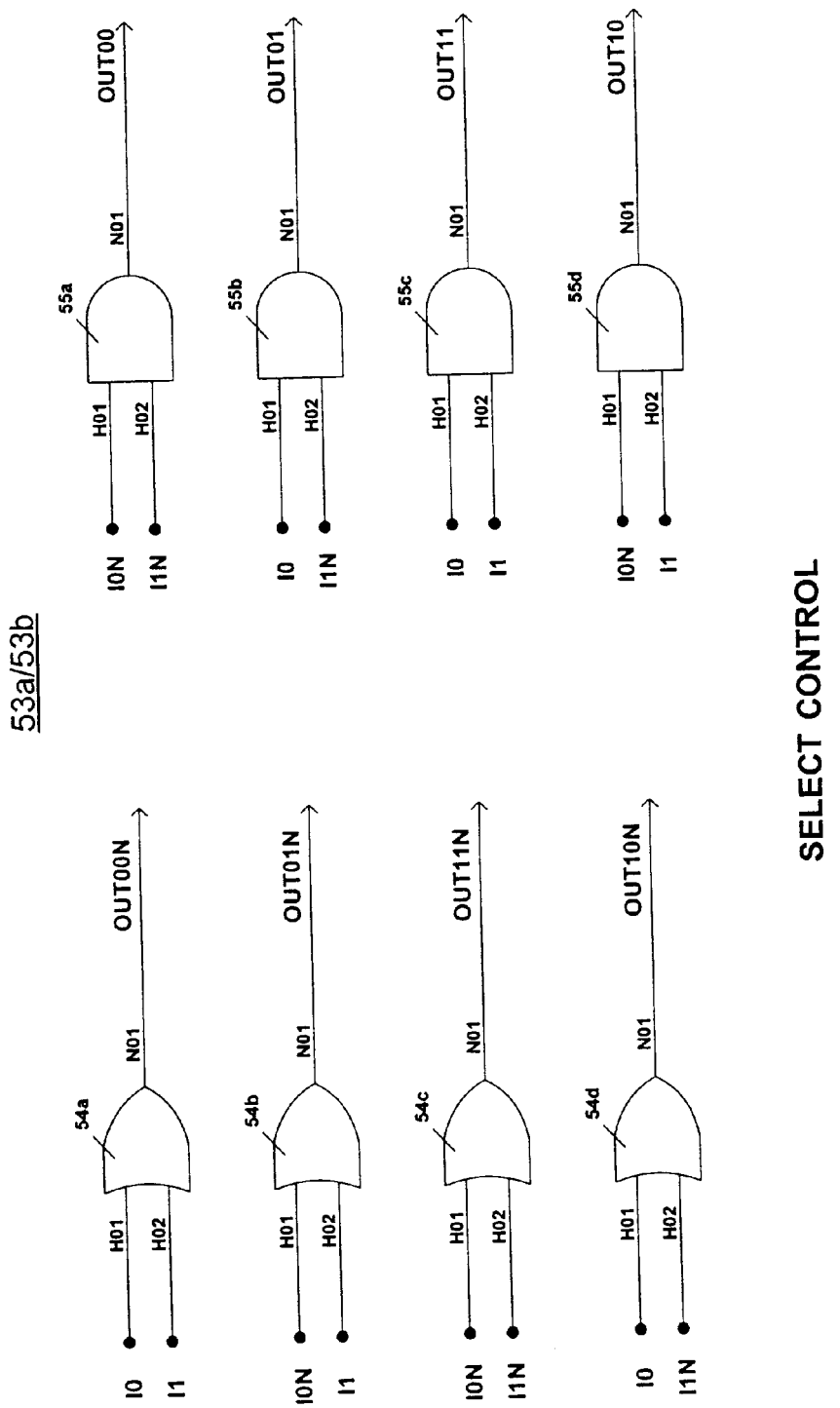
FIG. 19 shows the AND/OR gates used to generate phase multiplexor control signals.

FIG. 19 shows a gate level schematic diagram of control signal generation logic of both 53a and 53b. As shown, a group of OR and AND gates (54a–54d, 55a–55d) convert I<1:0>/IN<1:0> into output signals OUT00, OUT01, OUT11, and OUT10. The OR/AND gates (54a–54d, 55a–55d) decode the gray code to generate multiplexor control signals S and SU (shown in the upper level drawing of FIG. 14).

OR Gate Implementation

Figure 20:
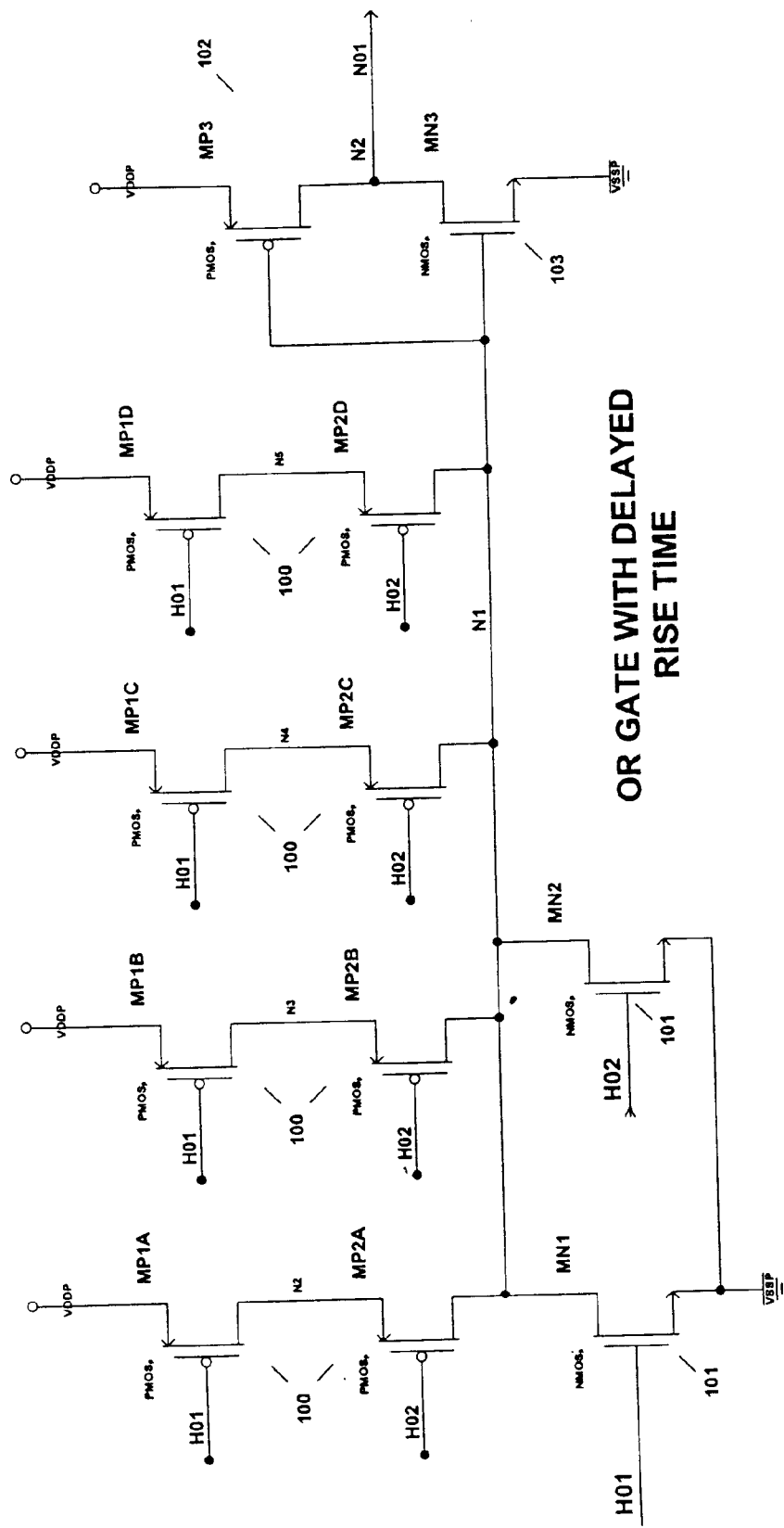
FIG. 20 is a detailed CMOS circuit diagram of the OR gates used to generate phase multiplexor control signals.

The OR gates can be implemented by the CMOS circuits shown in FIG. 20. The OR gates are realized by PMOS transistors 100/102 and NMOS transistors 101/103. The OR circuit includes PMOS transistors MP1A and MP2A. The source of MP1A is coupled to VDDP, the drain of MP1A is coupled to the source of MP2A, and the gate of MP1A is coupled to the input H01. The drain of MP2A is coupled to N1 and the gate of MP2A is coupled to input H02. PMOS transistor pairs MP1B/MP2B, MP1C/MP2C, and MP1C/MP2C are similarly configured. The drain of NMOS transistor MN1 is coupled to node N1, the source of MN1 is coupled to VSSP, and the gate of MN1 is coupled to H01. The drain of NMOS transistor MN2 is coupled to node N1, the source of MN2 is coupled to VSSP, and the gate of MN2 is coupled to H02.

The source of PMOS transistor MP3 is coupled to VDDP, the drain of MP3 is coupled to output N01, and the gate of MP3 is coupled to N1. The drain of NM3 is coupled to output N01, the source of MN3 is coupled to VSSP, and the gate of MN3 is coupled to N1. MP3 and MN3 are therefore configured as an output driver of the OR gate.

Their are four pairs of PMOS transistors forming the upper side of the OR gate and only one pair of NMOS transistors forming the lower side of the OR gate. Consequently, the output N01 tends to have a relatively fast rise time with respect to a change in input values H01 and H02. Conversely, the output N01 has a relatively slow fall time with respect to a change in input values H01 and H02. In other words, the propagation delay of the OR gate is larger for high-to-low transitions of the output N01 than for low-to-high transitions of output N01. The difference in delay is determined both by the number of transistor pairs on the upper and lower side of the OR gate and the size of the transistor pairs on the upper and lower side of the OR gate. Consequently, the difference in propagation delays can be readily controlled by the selection of design parameters such as the size and number of transistors.

AND Gate Implementation

Figure 21:
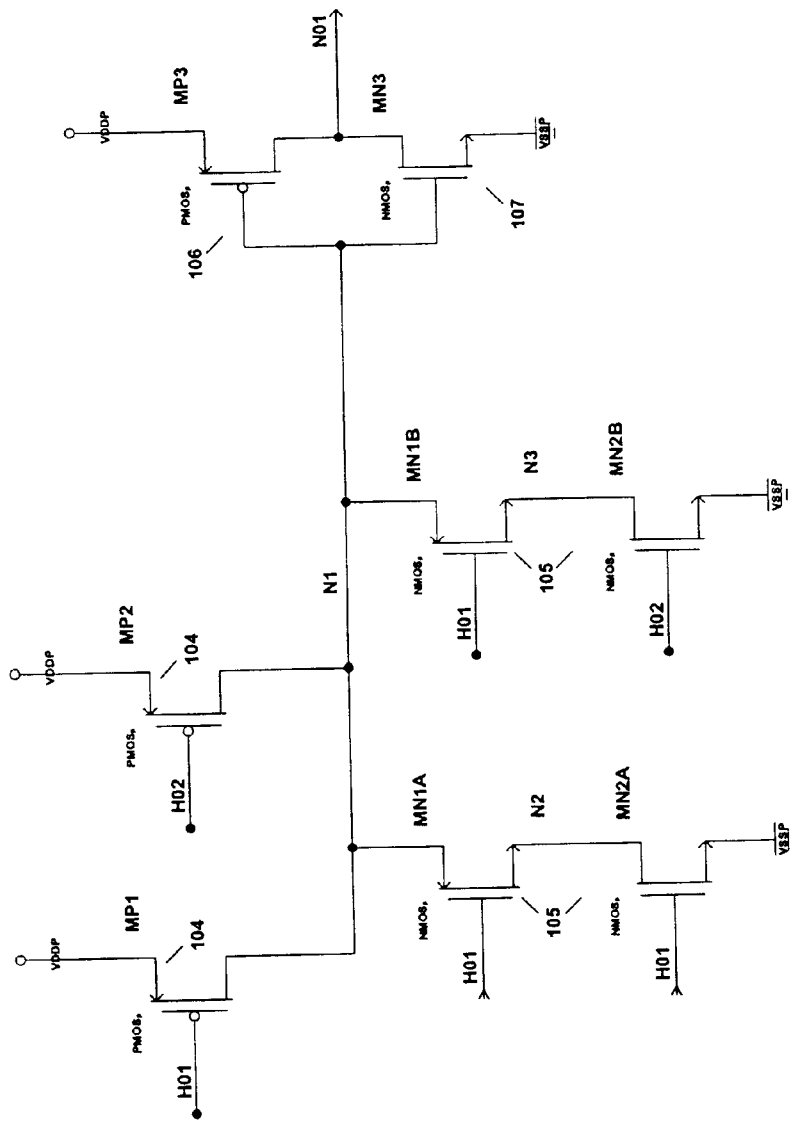
FIG. 21 is a detailed CMOS circuit diagram of the AND gates used to generate phase multiplexor control signals.

The AND gates are implemented by the CMOS circuits shown in FIG. 21. The AND gates are realized by PMOS transistors 104/106 and NMOS transistors 105/107. The AND circuit includes PMOS transistors MP1 and MP2. The source of MP1 is coupled to VDDP, the drain of MP1 is coupled to node N1, and the gate of MP3 s coupled to input H01. The source of MP2 is coupled to VDDP, the drain of MP2 is coupled to node N1, and the gate of MP2 is coupled to input H02. The drain of MN1A is coupled to node N1, the source of MN1A is coupled to the drain of MN2A, and the gate of MN1A is coupled to input H01. The source of MN2A is coupled to VSSP and the gate of MN2A is coupled to input H02. NMOS transistors MN1B and MN2B are similarly configured.

The source of MP3 is coupled to VDDP, the drain of MP3 is coupled to output N01, and the gate of MP3 is coupled to node N1. The drain of MN3 is coupled to output N01, the source of MN3 is coupled to VSSP, and the gate of MN3 is coupled to node N1. Accordingly, transistor pair MP3 and MN3 form the output driver of the AND gate.

Their are two pairs of NMOS transistors forming the lower side of the AND gate and only one pair of PMOS transistors forming the upper side of the AND gate. Consequently, the output N01 tends to have a relatively slow rise time with respect to a change is input values H01 and H02. Conversely, the output N01 has a relatively fast fall time with respect to a change in input values H01 and H02. In other words, the propagation delay of the AND gate is larger for low-to-high transitions of the output N01 than for high-to-low transitions of output N01. The difference in delay is determined both by the number of transistor pairs on the upper and lower side of the AND gate and the size of the transistor pairs on the upper and lower side of the AND gate. Consequently, the difference in propagation delays can be readily controlled by the selection of design parameters such as the size and number of transistors.

Inverting Phase Multiplexor

Figure 22:
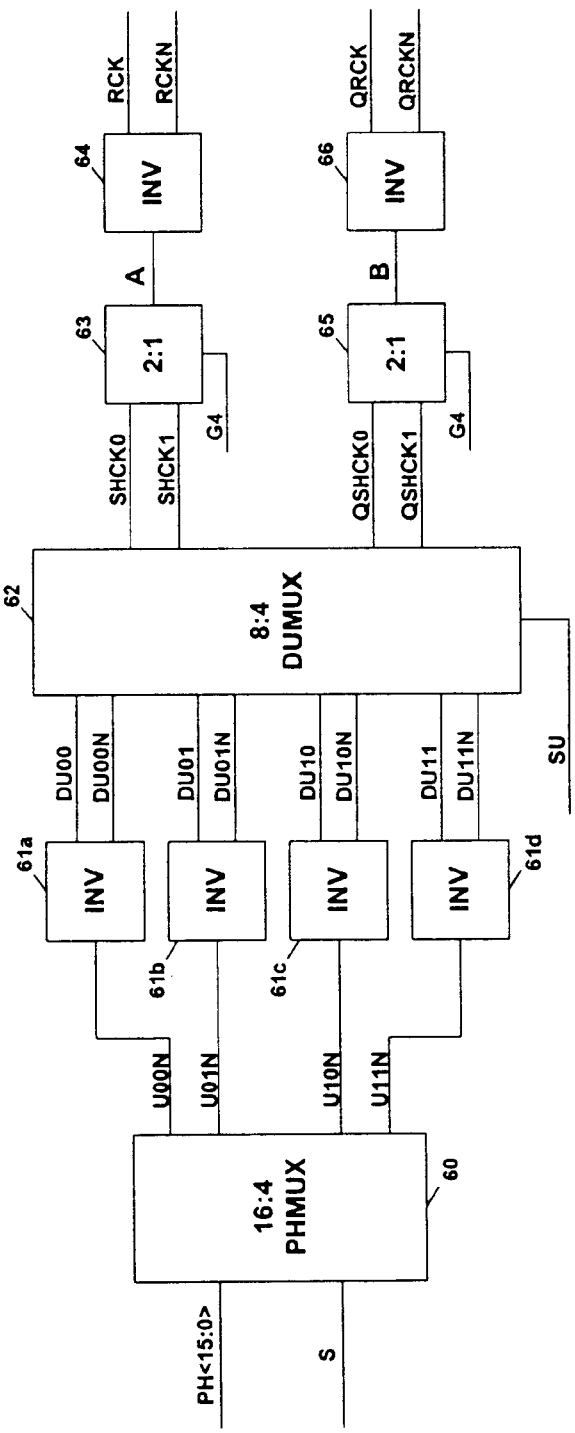
FIG. 22 is a block diagram of the inverting phase multiplexor of the present invention.

FIG. 22 shows one embodiment of the phase multiplexor 6. As shown, phase multiplexor 6 includes a 16:4 PHMUX 60, invertors (INV) 61a–61d, 8:4 DUMUX 62, two 2:1 multiplexors 63 and 65, and two invertors (INV) 64 and 66. As shown, the 16:4 PHMUX 60 receives 16 reference clocks PH<15:0> from the multi-phase clock generator shown in FIG. 3. As previously described, the clock signals include phases within one half of a half-speed clock cycle period T. The 16:4 PHMUX also receives select signals S.

The four outputs (U00N, U01N, U10N, and U11N) of the 16:4 PMUX 60 are inverted by invertors INV 61a–61d to produce a set of 4 half-speed clocks (DU00, DU01, DU11, and DU10) and the complement of the set of 4 half-speed clocks (DU00N, DU01N, DU11N, and DU10N), referred to as DU. The eight clock signals DU are received by 8:4 DUMUX 62. Of these 8 clock signals, DUMUX 62 selects 4 clocks (SHCK0, SHCK1, QSHCK0, and QSHCK1). Based upon the select signal G4, multiplexors 63 and 65 are controlled to select between SHCK0/SHCK1 and QSHCK0/QSHCK1, respectively, to generate signal A and signal B. Invertors 64 and 66 invert signals A and B output from the multiplexors 63 and 65 to produce four quadrature phase clock signals RCK, RCKN, QRCK, and QRCKN.

Figure 23:
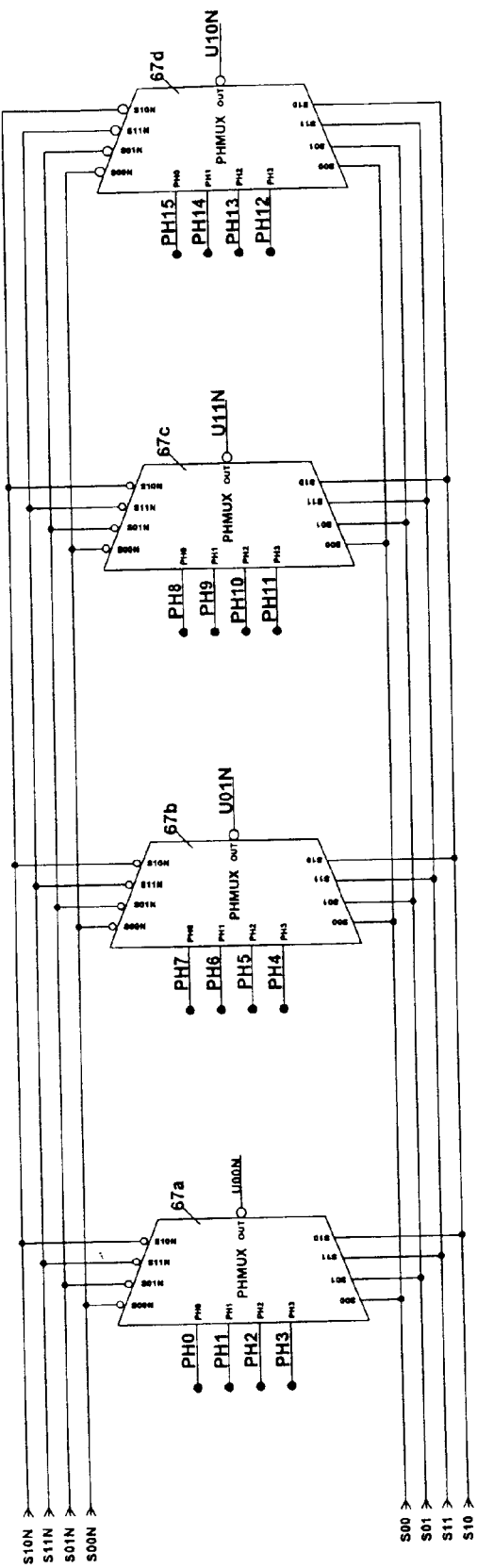
FIG. 23 is a block diagram of a 16:4 PHMUX of the phase multiplexor shown in FIG. 22.

FIG. 23 is a more detailed drawing of the 16:4 PHMUX 60. The 16:4 PHMUX 60 includes four 4:1 PHMUXs 67a–67d. Each of 4:1 PHMUXs 67a–67d receive as inputs select S which includes signals S00/S00N, S01/S01N, S10/S10N, and S11/S11N. Additionally, 4:1 PHMUX 67a receives reference clocks PH<3:0>, 4:1 PHMUX 67b receives reference clocks PH<7:4>, 4:1 PHMUX 67c receives reference clocks PH<11:8>, and 4:1 PHMUX 67d receives reference clocks PH<15:12>. The outputs of 4:1 PHMUXs 67a–67d generate output signals U00N, U01N, U11N, and U10N, respectively.

Figure 24:
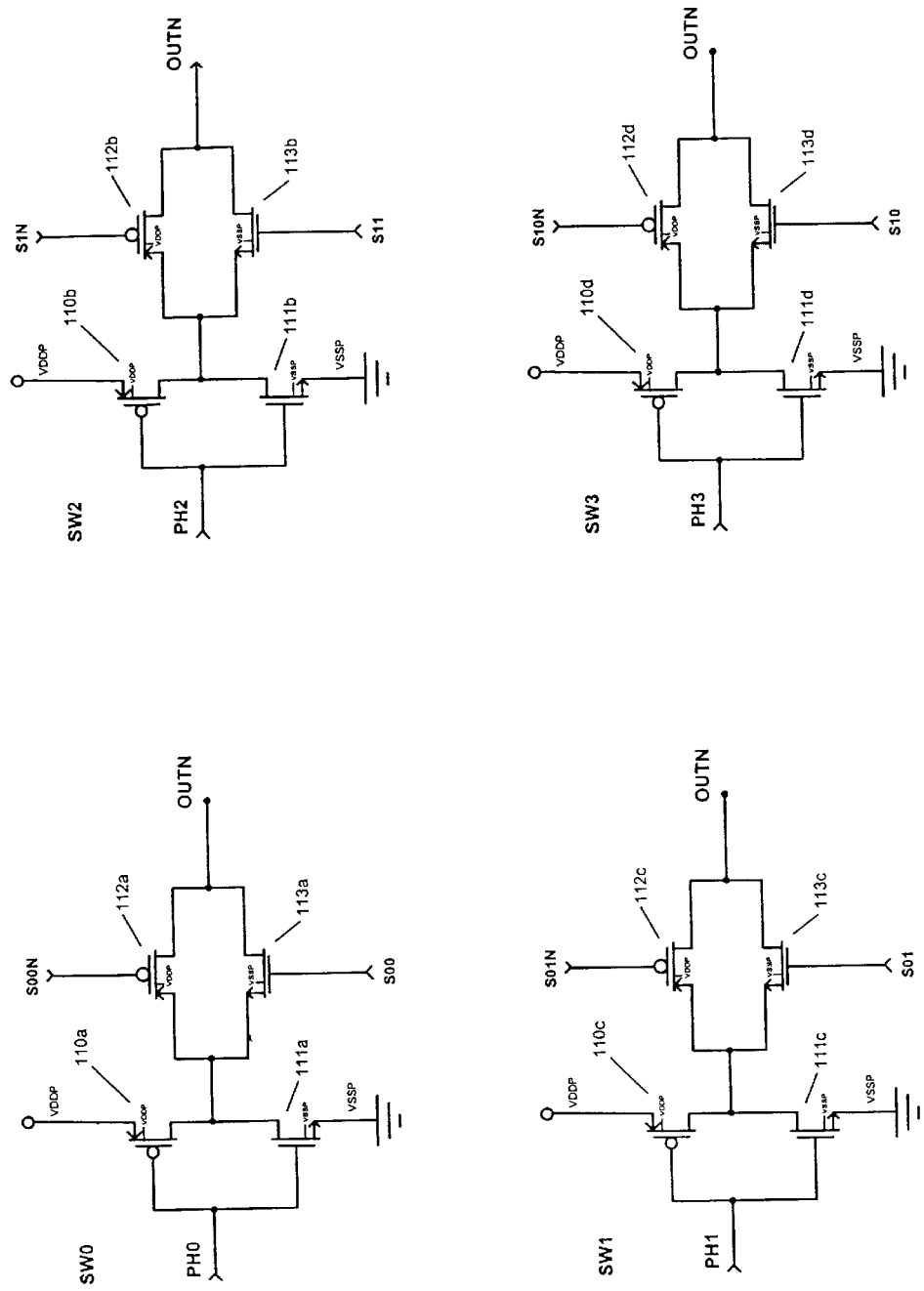
FIG. 24 is a circuit diagram of one of the 4:1 PHMUXs of FIG. 23.

FIG. 24 is a detailed drawing of 4:1 PHMUXs 67a–67d. Each of 4:1 PHMUXs 67a–67d contains four switches SW0–SW3. Switches SW0–SW3 receive input clocks PH0, PH1, PH2, and PH3, respectively, and have outputs coupled to a common output node OUTN. Further SW0–SW3 are controlled, respectively, by select signals S00/S00N, S01/S01N, S11/S11N, and S10/S10N.

Switch SW0 includes CMOS input buffer pair 110a/111a driving CMOS switch pair 112a/113a. Switch SW1 includes CMOS input buffer pair 110b/111b driving CMOS switch pair 112b/113b. Switch SW2 includes CMOS input buffer pair 110c/111c driving CMOS switch pair 112c/113c. Switch SW3 includes CMOS input buffer pair 110d/111d driving CMOS switch pair 112d/113d.

Figure 25:
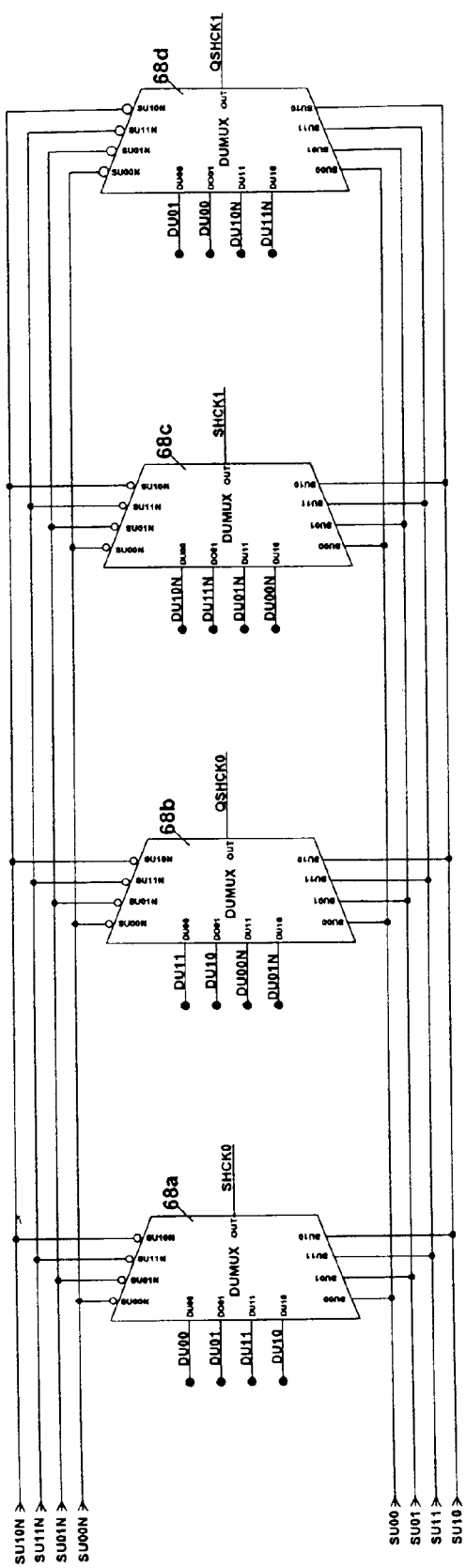
FIG. 25 is a block diagram of an 8:4 DUMUX of the phase multiplexor shown in FIG. 22.

FIG. 25 is a more detailed drawing of the 16:4 DUMUX 62. The 16:4 DMUX 62 includes four 4:1 DUMUXs 68a–68d. Each of 4:1 DUMUXs 68a–68d receive as inputs SU which includes signals SU00/SU00N, SU01/SU01N, SU10/SU10N, and SU11/SU11N. 4:1 DUMUX 68a receives clocks DU00, DU01, DU11, and DU10. 4:1 DUMUX 68b receives clocks DU11, DU10, DU00N, and DU01N. 4:1 DUMUX 68c receives clocks DU10N, DU11N, DU01N, and DU00N. DUMUX 68d receives clocks DU01, DU00, DU10N, and DU11N. The outputs of 4:1 DUMUXs 68a–68d generate output signals SHCK0, QSHCK0, SHCK1, and QSHCK1, respectively.

Figure 26:
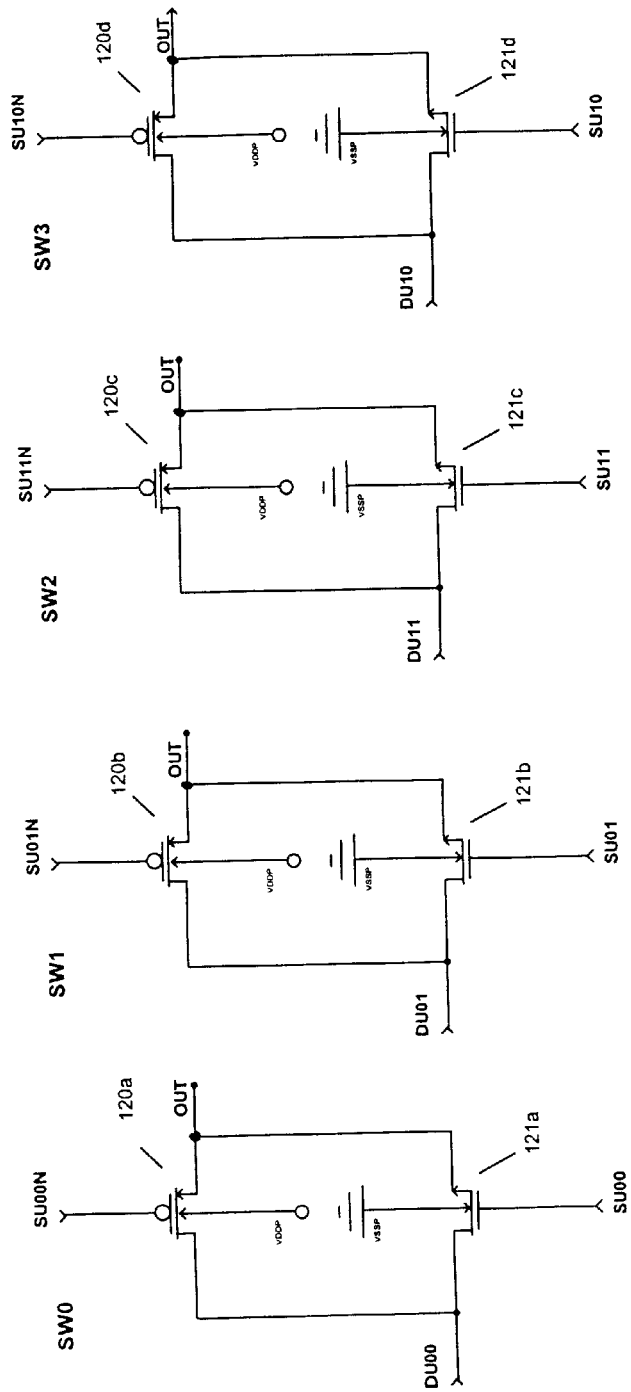
FIG. 26 is a circuit diagram of one of the 4:1 DUMUXs of FIG. 25.

FIG. 26 is a detailed drawing of the 4:1 DUMUXs 68a–68d. Each of 4:1 DUMUXs 68a–68d include four switches SW0–SW3. SW0 includes CMOS transistor pair 120a/121a, which receives input signal DU00 and is controlled by input select signals SU00/SU00N. SW1 includes CMOS transistor pair 120b/121b, which receives input signal DU01 and is controlled by input select signals SU01/SU01N. SW2 includes CMOS transistor pair 120c/121c, which receives input signal DU11 and is controlled by input select signals SU11/SU11N. SW3 includes CMOS transistor pair 120d/121d, which receives input signal DU10 and is controlled by input select signals SU10/SU10N. The outputs of switches SW0–SW3 are coupled to output node OUT.

Operation

Figure 6:
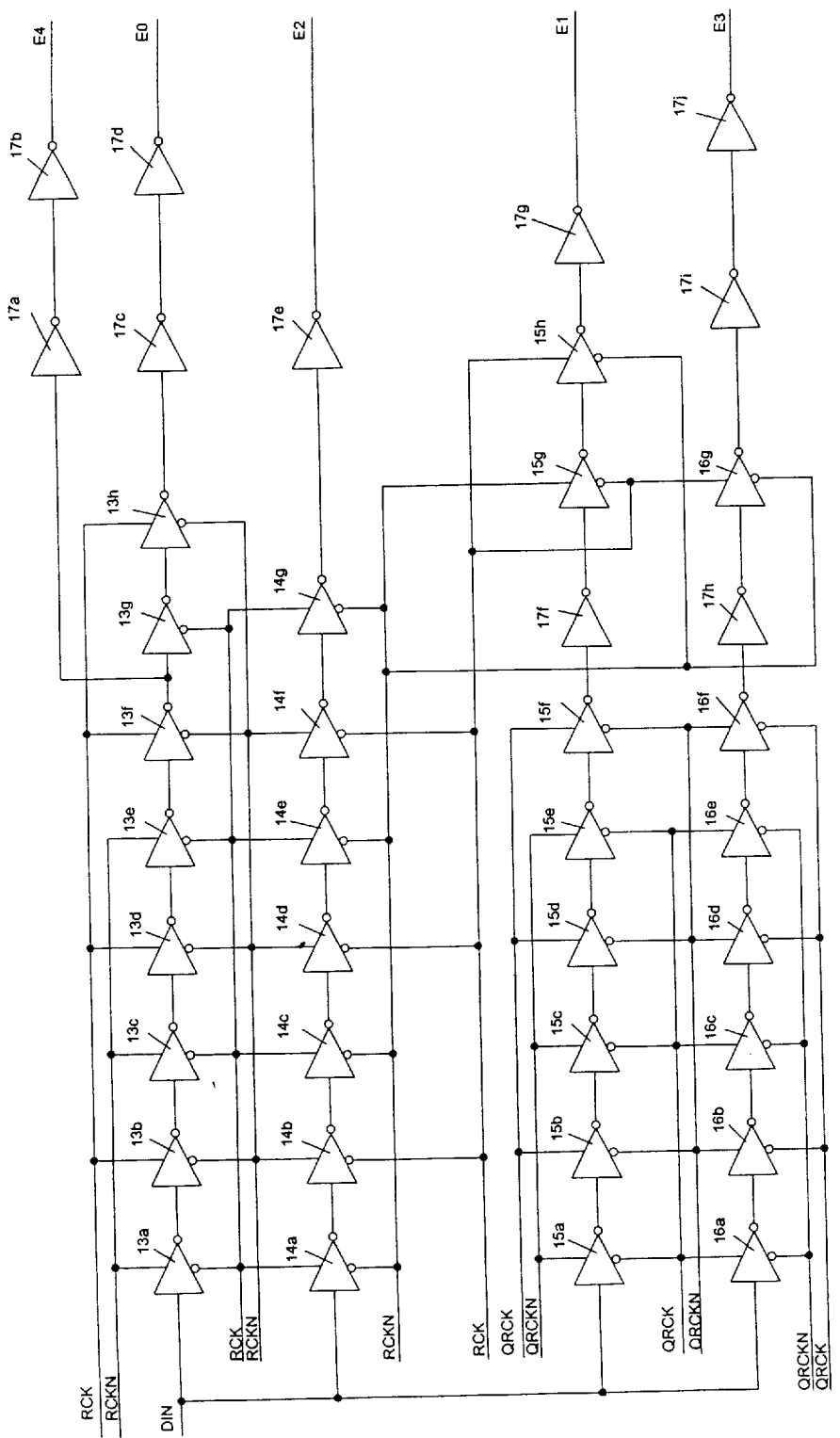
FIG. 6 is a schematic diagram of delay lines used in the phase detector of FIG. 1.

The operation of the multiple clock recovery circuits will now be described. As shown in FIG. 6, the phase detector receives four quadrature phase signals RCK, RCKN, QRCK, and QRCKN. These clocks operate at half-speed relative to the input data DIN. Because the rising edges of feedback reference clocks RCK, RCKN, QRCK, and QRCKN are selected to have relative phases of 0°, 90°, 270°, and 180°, they are able to sample the input data DIN at twice the frequency of DIN. Each of the feedback reference clocks drive one of the delay lines and input data DIN is supplied to all of the inputs of the delay lines.

As shown in the timing diagram of FIG. 7, the delay lines sample input data DIN on the rising edges of RCK, QRCK, RCKN, and QRCKN. To accomplish this, a sliding data window is implemented by selecting the number of delay cycles of each delay line and synchronizing the final stages of each delay line with clock signal RCK. As shown, the sliding data window includes a snapshot of samples E0–E4. Consequently, data samples E0–E4 of DIN can be analyzed statistically to measure the time position of DIN relative to the feedback reference clock RCK.

This analysis is performed by logic circuit 30 which implements the logic table of FIG. 9. For example, if samples E0=0, E1=0, and E2=0, no phase determination can be made because no transitions have occurred. If, for example, E0=1, E1-0, and E2=0, then the feedback reference clock RCK is beginning to lead the data DIN. If E0=0, E1=1, and E2=0, then the RCK is likely coincident with a transition of DIN and the RCK is considered (by default) to lag the phase of the input data DIN. A similar analysis is also performed on samples E2, E3 and E4 as shown in the table of FIG. 9. In this manner, the input data DIN can be analyzed at twice the rate of the input data DIN over 2 bit periods. Logic circuit 30 calculates signals indicating upward and downward positions during one bit period and generates U1=1 up (E0–E2), U2=1 up (E0–E2), D1=1 down (E2–E4), and D2-2 down (E2–E4). The results U1, D1, U2, and D2 are synchronized with RCK and then supplied to logic circuit 32.

Logic circuit 32 analyzes the leading/lagging indicators U1, U2, D1, D2 observed over 2 bit periods and determines the net number of transitions suggesting an upward or downward movement of the feedback reference clocks relative to the phase of the input data DIN. Logic circuit 32 implements the logic table of FIG. 10 and generates output signals UP1N, DOWN1N, UP2N, and DOWN2N, which are synchronized with RCK and stored in registers 33a–d. The inverted outputs of 33a–d generate a set of signals that indicate the magnitude and direction of a phase error between the feedback reference clock RCK and the input data DIN. However, these signals UP1, DOWN1, UP2, DOWN2 represent relatively short-term trends in feedback reference clock error. These short-term trends may be due to temporary noise in the data channel DIN rather than on an actual phase misalignment of clock signal RCK. Consequently, it is not advisable to adjust the phase of the RCK clock based on such a small sample.

To obtain a more accurate, albeit less responsive measure of phase error, the phase errors represented by signals, UP1, DOWN1, UP2, and DOWN2, are averaged, or filtered, by the lowpass digital filter 4. The lowpass digital filter 4 is implemented as a 2 stage filter. The first of the two stage filter is referred to as a fast filter because it has a relatively high input data rate in the form of error signals UP1, UP2, DOWN1, and DOWN2. The fast filter 40 reduces the data rate of the error signal to produce filter error signals UP4 and DOWN4. Fast filter 40 also generates a corresponding clock signal UPNX which coincides with the assertion of either UP4 or DOWN4.

As shown in FIG. 11, fast filter 40 is implemented with a 3-bit up/down counter that keeps a running average of the number of UP and DOWN indications from the phase detector. When the average of UPS of DOWNS becomes high enough (in this case 3), counter 40 rolls over and the UP4 or DOWN4 signal is asserted thereby indicating that a net total of 4 UP indications or a net total of 4 DOWN indications have occurred.

As shown in FIG. 13, the second stage of the digital lowpass filter is the slow filter 47. The slow filter 47 has a similar implementation as fast filter 40, except that it has a potential maximum and minimum count of ±15. Further, slow filter 47 has the added feature of adjustable coefficients which define the maximum and minimum count before rollover. Slow filter 47 keeps track of the average of the UP4/DOWN4 signals thereby maintaining a running average of the total UP/DOWN indication count. A rollover and resulting PHUP or PHDOWN signifies that there is a strong indication that the RCK has drifted permanently away from the phase of the input data DIN. A clock signal PHCK is generated coincidentally with either PHUP or PHDOWN.

A two-stage filter is advantageous because the second stage can operate at a relatively slow rate and therefore consume less power. The first stage operates at a faster rate but has a minimal amount of circuitry. Therefore, the two-stage digital filter consumes very little power. Also, the two-stage filter has a relatively simple mechanism for adjusting the bandwidth of the filter by the use of programmable coefficients.

With reference to FIG. 14, signals PHUP and PHDOWN, in conjunction with PHCK, are received by the phase counter 50 of the phase store/control 5. A PHUP signal causes the phase counter 50 to increment by "1" and a PHDOWN signal causes the phase counter 50 to decrement by "1", thereby adjusting the phase of the reference clocks RCK, RCKN, QRCK, and QRCKN in the phase locked loop of the clock recovery circuit.

However, it is not practical to directly decode the binary count of the phase counter 50 to generate multiplexor control signals S and SU. A direct decode of the binary count to generate the control signals creates the possibility of causing glitches in the output clocks from the output of the phase multiplexor. For example, a binary phase count change from BPH=1000 binary to BPH=0111 binary causes transitions to occur for all four of the binary phase counter bits. Conventionally, non-uniform propagation delays in combinational logic and/or register paths could cause the multiplexor select lines S and SU to fluctuate momentarily while the slowest path in the combination decode logic has propagated a signal. If this situation were to occur, any one of the 16 multiplexor select lines S and SU could fluctuate momentarily, causing various phases of PH<15:0> to be temporarily selected and output from the phase multiplexor.

Consequently, the output from the phase selector could rapidly select multiple input clocks until the control signals have settled. With static control signals or data, this is generally not a problem because the output of multiplexors can be synchronously registered. However, momentary glitches are not acceptable when generating clock signals that directly drive sequential circuitry. This is because information is carried in the selected clock edge rather than in the static state of the signal. Accordingly, for a phase multiplexor that multiplexes clock signals, only two select line pairs (e.g., S00/S00N and S01/S01N) should transition per phase change of the phase counter.

To accomplish this, the binary output count BPH<3:0> of the phase counter 50 is first converted into a gray code PGN<3:0> by gray code generation logic 51. The gray code PGN<3:0> has the property that only 1 bit of the 4 bit word changes states per increment or decrement. Consequently, only 1 pair of complementary registered gray code signals G0N/G0, G1N/G1, G2N/G2, and G3N/G3 change states for each increment or decrement of the binary phase counter 50. Additionally, G4 is used to double to 32 the number of phases that can be selected.

As shown in the tables of FIGS. 17 and 18, the gray code G0–G4 increments/decrements over 32 possible phases without changing more than 1 bit of the 5 bit gray code per increment. Accordingly, as can be seen from FIGS. 15 and 16, only two control signal pairs from the group of eight control signals (S00/S00N, S01/S01N, S10/S10N, S11/S11N, SU00/SU00N, SU01/SU01N, SU10/SU10N, and SU11/SU11N) change per gray code increment or decrement. This control method therefore prevents glitches in the output of the phase multiplexor by reducing the number of control lines that simultaneously transition during a phase count increment/decrement.

Control signals S are based on gray code bits G0 and G1 and determine an initial selection of half-speed clocks PH<15:0> by the 16:4 PMUX 60. Specifically, as shown in FIG. 15, combinations of gray code bits G0 and G1 select reference clocks in groups of (PH15, PH8, PH7, and PH0), (PH14, PH9, PH6, and PH1), (PH13, PH10, PH5, and PH2), and (PH12, PH11, PH4, and PH3).

Figure 27:
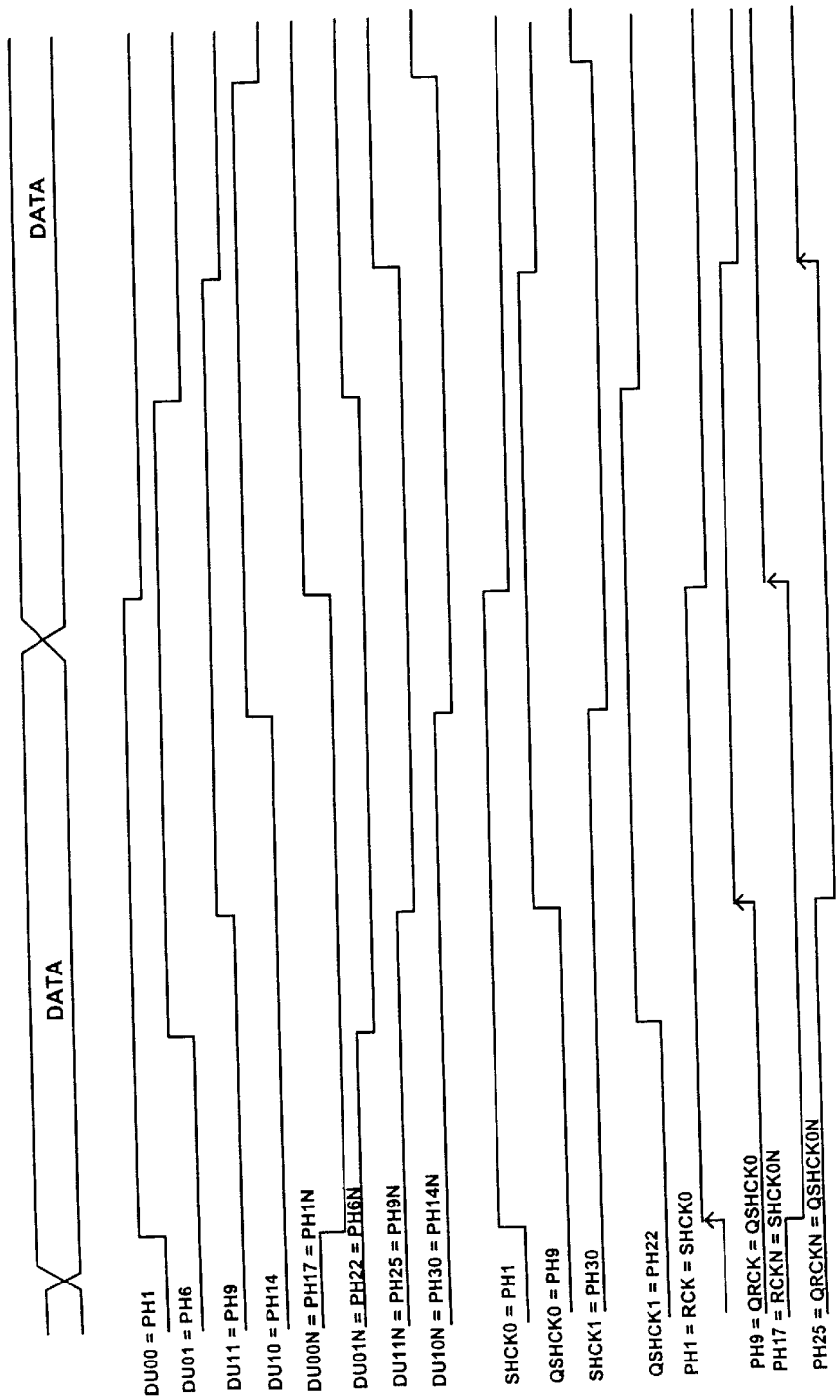
FIG. 27 is an exemplary timing diagram showing the process for the selection of four clocks from the clock generator of FIG. 2.

With reference to the inverting phase multiplexor 6 shown in FIG. 22 and the exemplary timing diagram shown in FIG. 27, an example of one such selection is shown. With gray code bits G0=1 and G1=0, the 16:4 PMUX 60 chooses clocks PH<14, 9, 6, and 1>. The invertors 61a–61d both buffer and invert PH<14, 9, 6, and 1> to generate additional signals PH<30, 25, 22, and 17> thereby creating a set of eight signals equally spaced within one half-speed clock cycle period T. These clock signals are identified as DU00/DU00N, DU01/DU01N, DU10/DU10N, and DU11/DU11N in the inverting phase multiplexor of FIG. 22.

Control signals SU are based on gray code bits G2 and G3 and determine a secondary selection of half-speed clocks DU00/DU00N, DU01/DU01N, DU10/DU10N, and DU11/DU11N by the 8:4 DMUX 62. Specifically, as shown in FIG. 16, combinations of gray code bits G2 and G3 select reference clocks in groups of (DU00, DU01, DU10, and DU11), (DU11, DU10, DU00N, and DU01N), (DU10N, DU11N, DU01N, and DU00N), and (DU01, DU00, DU10N, and DU11N).

With reference to the inverting phase multiplexor 6 shown in FIG. 22 and the exemplary timing diagram shown in FIG. 27, an example of one such secondary selection is shown. With gray code bits G2=0 and G3=0, the multiplexor chooses PH<1, 9, 30, and 22>. The multiplexors 63 and 65 select either PH1/PH9 or PH30/PH22 based upon the state of select signal G4 and output clock signals A and B, respectively. The remaining two clock signals A and B are inverted by invertors 64 and 66 to generate four half-speed clock signals RCK, RCKN, QRCK, and QRCKN, equally spaced within one half-speed clock cycle period T.

Make Before Break Control of Inverting Phase Multiplexor

When clock signals having different phases are multiplexed onto a single output node via two or more controlled switches, there is the possibility that glitches will occur on the single output node. For example, FIG. 24 shows a detailed schematic of PMUX 67 with switches SW0 (112a, 113a) and SW1 (110c, 113c) which multiplex input signals PH0 and PH1 onto a single output node OUTN. The selection is based on the mutually exclusive assertion of input control signal pairs S00/S00N and S01/S01N.

Figure 28A:
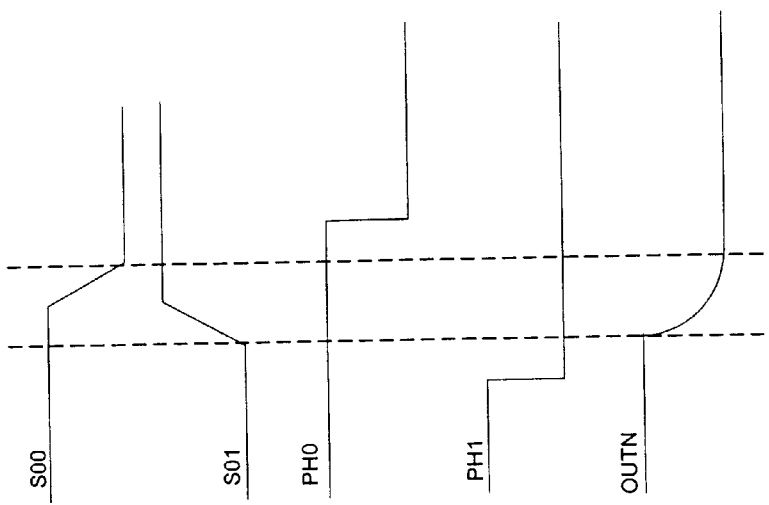
FIGS. 28a–28c are timing diagrams showing the operation of the make-before-break control method for the PHMUX and the DUMUX.

FIG. 28a is a timing diagram of the input control signals S00 and S01, input clock signals PH0 and PH1, and output clock OUTN. When the phase counter is incremented or decremented, for example from a 00001 to a 00010, the gray code changes from a 00001 to a 00011. This gray code change causes the control signal S00 to change from a high state to a low state thereby de-selecting clock signal PH00. Further, this gray code change causes the control signal S01 to change from a low state to a high state thereby selecting input clock signal PH1. Changes to the input control signals are asynchronous to the input clock signal edges.

Figure 28B:
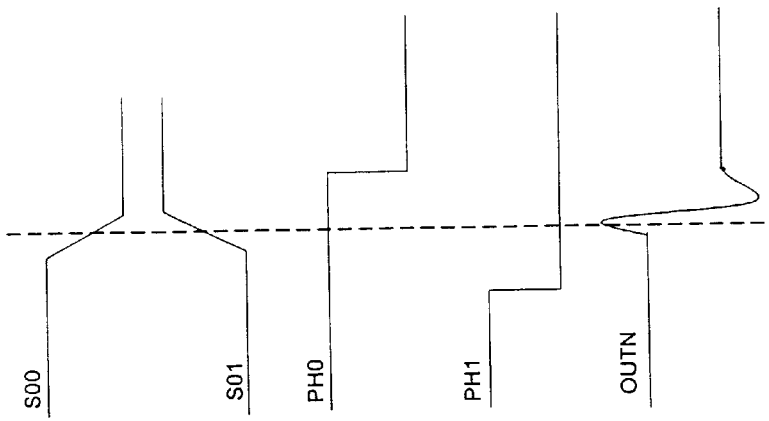

Conventionally, state changes of the input control signals S00/S00N and S01/S01N occur at approximately the same time. In one case, the control signal state change occurs when input clock PH0 and PH1 are both LOW. Accordingly, no glitches, or transients, occur on the OUTN node. However, as shown in FIG. 28b, the control signal state change can occur when the input clock signal PH0 is high and the input clock signal PH1 is LOW. Consequently, as can be seen, a glitch occurs on the output OUTN. This glitch is due to the momentary effect caused when the outputs of the switches 100 and 101 are both turned partially OFF.

Figure 28C:
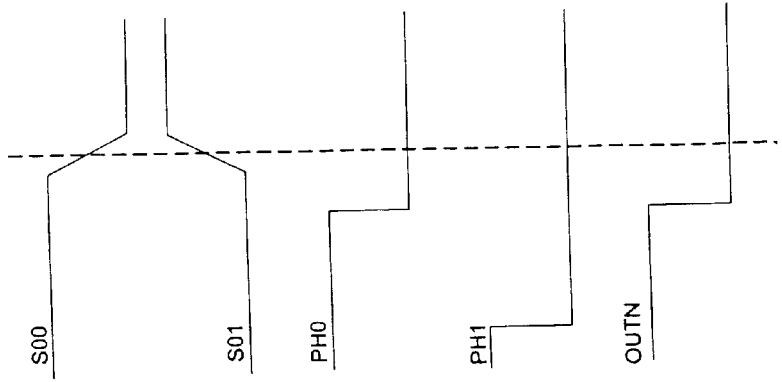

As shown in FIG. 28c, one solution to the aforementioned problem is to delay the deassertion of the de-asserting control signal (e.g., S00/S00N) relative to the assertion of the asserting signal (e.g., S01/S01N). It has been found that making the connection of the selected clock before breaking the connection of the de-selected clock provides a more favorable and glitch-free output clock. As shown, when S01/S01N selects PH1, the output PH0UT is momentarily being driven by both PH0 and PH1. Accordingly, the output OUT has a slow, and relatively gentle falling slope. Further, once the output is being fully driven by clock signal PH1, clock signal PH0 is then removed from the output OUTN. Therefore, it is important to adjust the rising and falling characteristics of input control signals (e.g., S00/S00N and S01/S01N) to create such a delay.

As shown in FIGS. 19–21, one simple way to accomplish this delay is to adjust the rise and fall times of the control gate in the final stage of gray code to control signal decode. As previously discussed, the rise and fall times of the OR/AND (54a–55d and 55a–55d) gates can be adjusted by selecting the size and number of transistors on the upper and lower side of the CMOS gates. The OR gate has a faster rise time (selection) than fall time (de-selection) for generating the positive sense control signals. The AND gate has a faster fall time (selection) than rise time (de-selection) for generating the negative sense control signals. Further, any other method of providing a delay for the de-selecting control signals relative to the selecting control signals will solve the aforementioned problem.

The multi-channel clock recovery circuit using an inverting phase multiplexor offers significant advantages in power consumption. First, because only 16 of the 32 possible clock phases are carried via bus 13 from the multi-phase clock generator, less power is consumed, as compared to a 32 bit wide clock bus. Second, the inversion of the clock signals takes place after the initial selection of four of the 16 clocks PH<15:0>, rather than inverting all of the signals and then making the selection. This reduces the total number of inverted clock signals that must be generated and distributed.

The reduction in clock bus width also provides significant improvements in system performance. Typically, semiconductor layouts for multiple clock recovery circuits include a plurality of clock recovery circuits (implemented in the X direction) and a phase bus (implemented in the Y direction perpendicular to the X direction) so as to drive the phase multiplexors of each clock recovery circuit. Consequently, because of this layout, the width of the clock recovery circuits increases in proportion to the number of phases. Because the clock recovery circuits are positioned perpendicular to the phase bus, a 32-bit wide phase bus necessitates the use of undesirably wide clock recovery circuits. This naturally increases the length of the phase bus, thereby introducing noise and requiring higher power clock drivers. Therefore, it is important to minimize the number of phases in the phase bus. Accordingly, the 16 bit wide clock bus described in the inverting phase multiplexor of the present invention provides for a compact, low power, and low noise design while still offering 5-bit phase resolution.

Interpolating Phase Multiplexor

In order to ensure a low amount of jitter, the differences between the phases (i.e., phase resolution) generated by a VCO must be small. This requires the use of a VCO with numerous stages so as to generate small phase steps. In other words, the more stages the VCO has the smaller the steps are between stages. At high frequencies, however, it is difficult to build ring oscillators with a large number of stages. For example, if a frequency of 1.25 GHz with 32 different phase selections were desired, the ring oscillator would have to contain 16 stages with each stage having a propagation delay of only 50 ps (i.e., (1/1.25 Ghz)/16). In addition, the 32 outputs from the ring oscillator would have to be routed to the phase multiplexer, which would have to be able to switch between these outputs without adversely affecting the clock frequency. Further, the routing of the output lines and the multiplexing would have to maintain the 50 ps timing resolution. These high speed requirements would require a large amount of power dissipation and can be difficult to achieve with current commercial semiconductor processes.

Another embodiment of the phase multiplexor circuit 6 will now be described which solves the aforementioned problems. Specifically, an interpolating phase multiplexor is employed using 16 half-speed clocks and interpolating between adjacent phases of the 16 half-speed clocks to generate a total of 32 phases.

Figure 5:
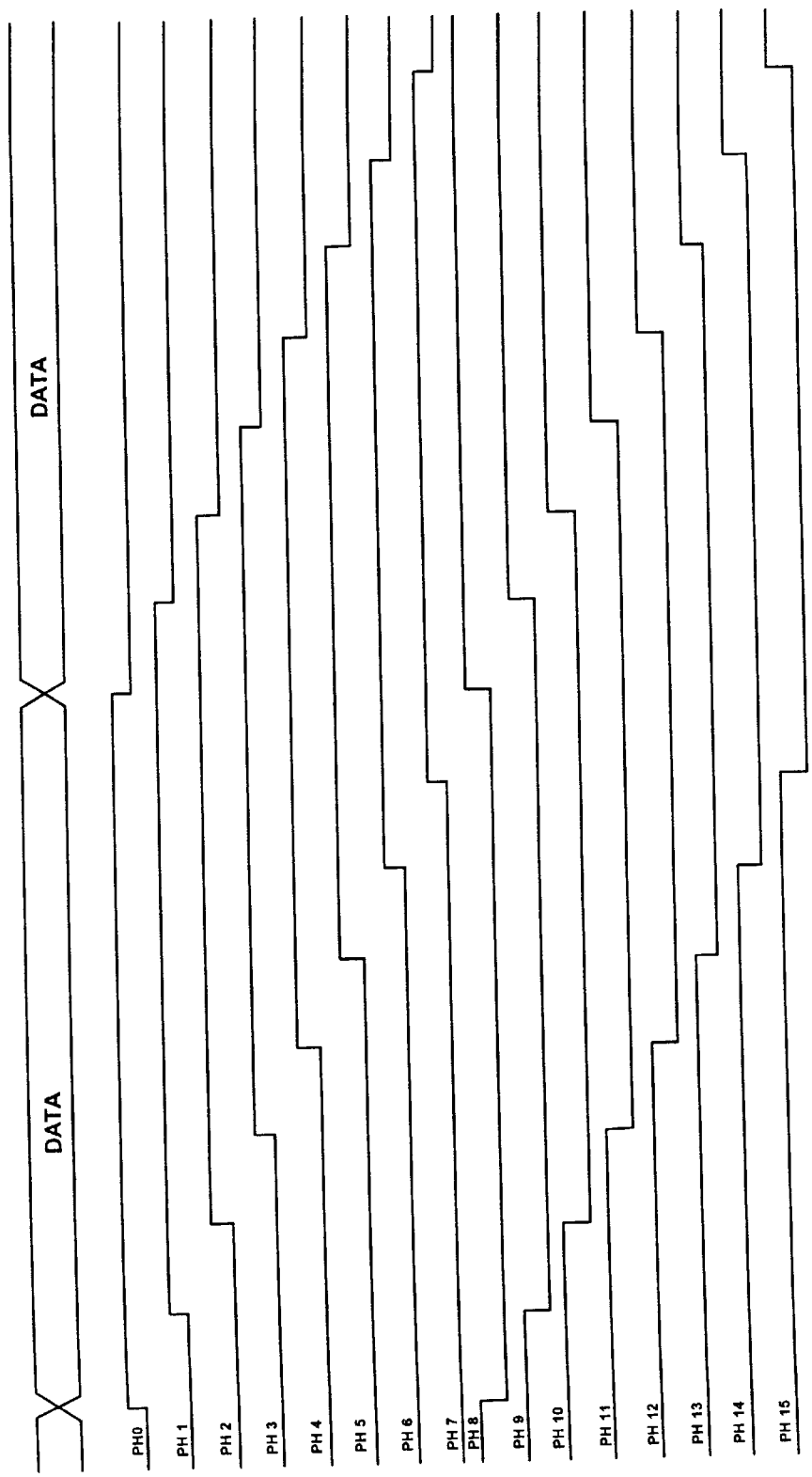
FIG. 5 is a timing diagram showing the output of the clock generator of FIG. 3.
Figure 29:
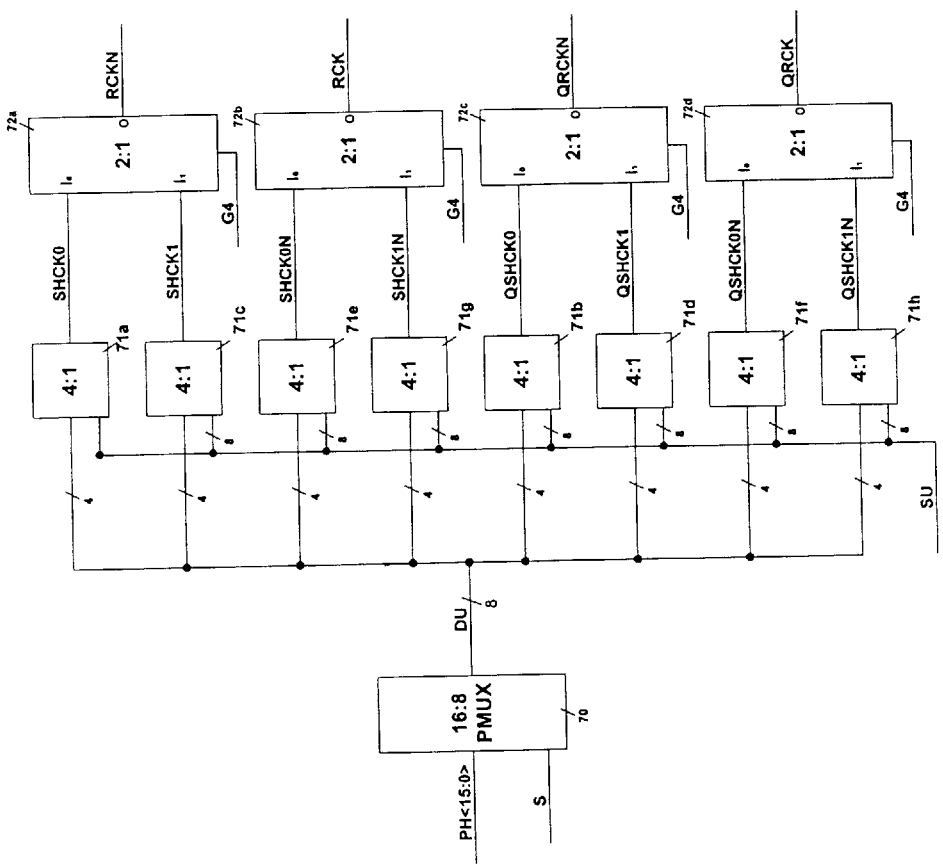
FIG. 29 is a block diagram of the interpolating phase multiplexor of the present invention.

FIG. 29 illustrates an interpolating phase multiplexor of the present invention. The interpolating phase multiplexor includes 16:8 PMUX 70, eight 4:1 DMUXS 71*a*–71*b*, and four 2:1 DMUXs 72*a*–72*d*. The 16:8 PMUX 70 receives 16 phases PH<15:0> from the phase generator 2 shown in FIG. 3. As shown in the timing diagram of FIG. 5, the 16 phases are equally space within one half-speed clock cycle period T. Further, the 16:8 PMUX 70 receives 8 select lines S which select 4 of the feedback reference clocks PH<15:0> and select 4 interpolated clock signals derived from PH<15:0>. The four selected signals and four selected interpolated signals, identified collectively as DU, are shown being output from the 16:8 PMUX 70.

The eight clock signals DU are distributed among eight 4:1 DMUXs 71*a*–71*h*. Each of the eight 4:1 DMUXs 71*a*–71*h* are controlled by select signals SU which select one clock signal from the four clock signals received by each of the 4:1 DMUxs 71*a*–71*h*. Four 2:1 DMUXs 72*a*–72*d* each receive two clock signals each output from a pair of DMUXs 71*a*–71*h*. Select signal G4 from phase counter 50 selects the final four clock signals RCK, RCKN, QRCK, and QRCKN, which are fed back into the phase detector 3 to calculate the phase error.

Figure 30:
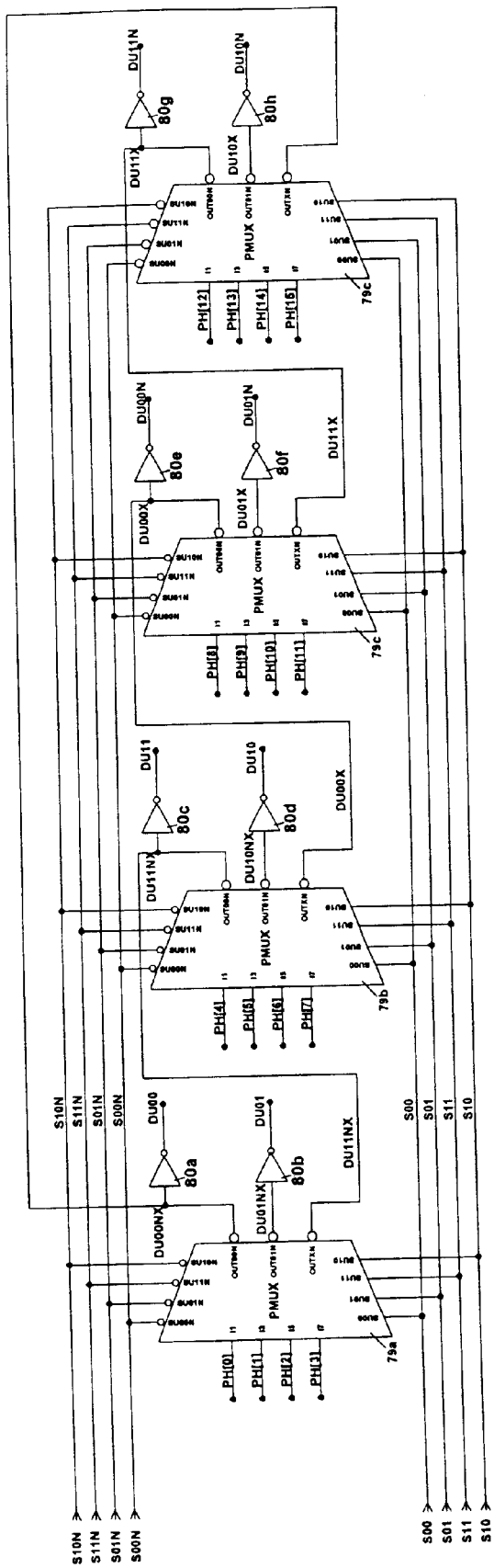
FIG. 30 is a block diagram of a 16:8 interpolating PMUX of the interpolating phase multiplexor of FIG. 29.

FIG. 30 shows a more detailed diagram of the 16:8 PMUX 70. As shown, PMUX 70 includes four 4:3 PMUXs 79*a*–79*d*. Each of the PMUXs 70*a*–79*d* receive four different signals from PH<15:0> into inputs I1, I3, I5, and I7, and generates three outputs OUT00N, OUT01N, and OUTNX. Select lines S are received by each of the four PMUXs 79*a*–79*d* to select the output signals OUT00N, OUT01N, and OUTXN. Output signal OUT00N is selected from input signals I1 and I3. Output signal OUT01N is selected from input signals I1, I3, and I5. Output signal OUT11N is selected (output enabled) or not selected (tri-stated) from input signal I7.

PMUX 79*a* generates signal DU01NX from its output OUT01N. DU01NX is inverted by inverter 80*b* to produce clock signal DU01. PMUX 79*a* generates signal DU00NX from its output OUT00N. DU00NX is inverted by inverted 80*a* to produce clock signal DU00. Finally, PMUX79*a* generates signal DU11NX.

PMUX 79*b* generates signal DU10NX from its output OUT01N. DU10NX is inverted by inverter 80*d* to produce clock signal DU10. PMUX 79*a* generates signal DU11NX from its output OUT00N. DU11NX is inverted by inverted 80*c* to produce clock signal DU11. Finally, PMUX79*a* generates signal DU00X.

PMUX 79*c* generates signal DU01X from its output OUT01N. DU01X is inverted by inverter 80*f* to produce clock signal DU01N. PMUX 79*a* generates signal DU00X from its output OUT00N. DU00X is inverted by inverted 80*e* to produce clock signal DU00N. Finally, PMUX79*a* generates signal DU11X.

PMUX 79*d* generates signal DU10X from its output OUT01N. DU10X is inverted by inverter 80*h* to produce clock signal DU10N. PMUX 79*d* generates signal DU11X from its output OUT00N. DU11X is inverted by inverted 80*g* to produce clock signal DU11N. Finally, PMUX79*a* generates signal DU00NX.

As shown, the outputs OUTXN from each of PMUXs 79*a*–79*d* are coupled to the outputs OUT00N of another one of the PMUXs 79*a*–79*d* in a circular fashion. Therefore, signals DU00NX, DU11NX, DU00X, and DU11X are each generated by the outputs of either one or two of the PMUXs 79*a*–70*d*. For example, when the output OUTXN of PMUX 79*d* is disabled, the signal DU00NX is the result of only the output OUT00N of PMUX 79*a*. When the output OUTXN of PMUX 79*d* is enabled, the signal DU00NX is a result of both the outputs OUT00N of PMUX 79*a* and OUTXN of PMUX 79*d*. The three other pairs of PMUXs 79*a*/79*b*, 79*b*/79*c*, and 79*c*/79*d* operate similarly. An interpolated clock signal results when two output clock signals are coupled onto the same node. The interpolated clock which has an edge transition approximately halfway between the transition edge of two adjacent clocks selected from PH<15:0>. Thus, a total of 32 phases can be selected/ generated by the PMUX 70.

Figure 31:
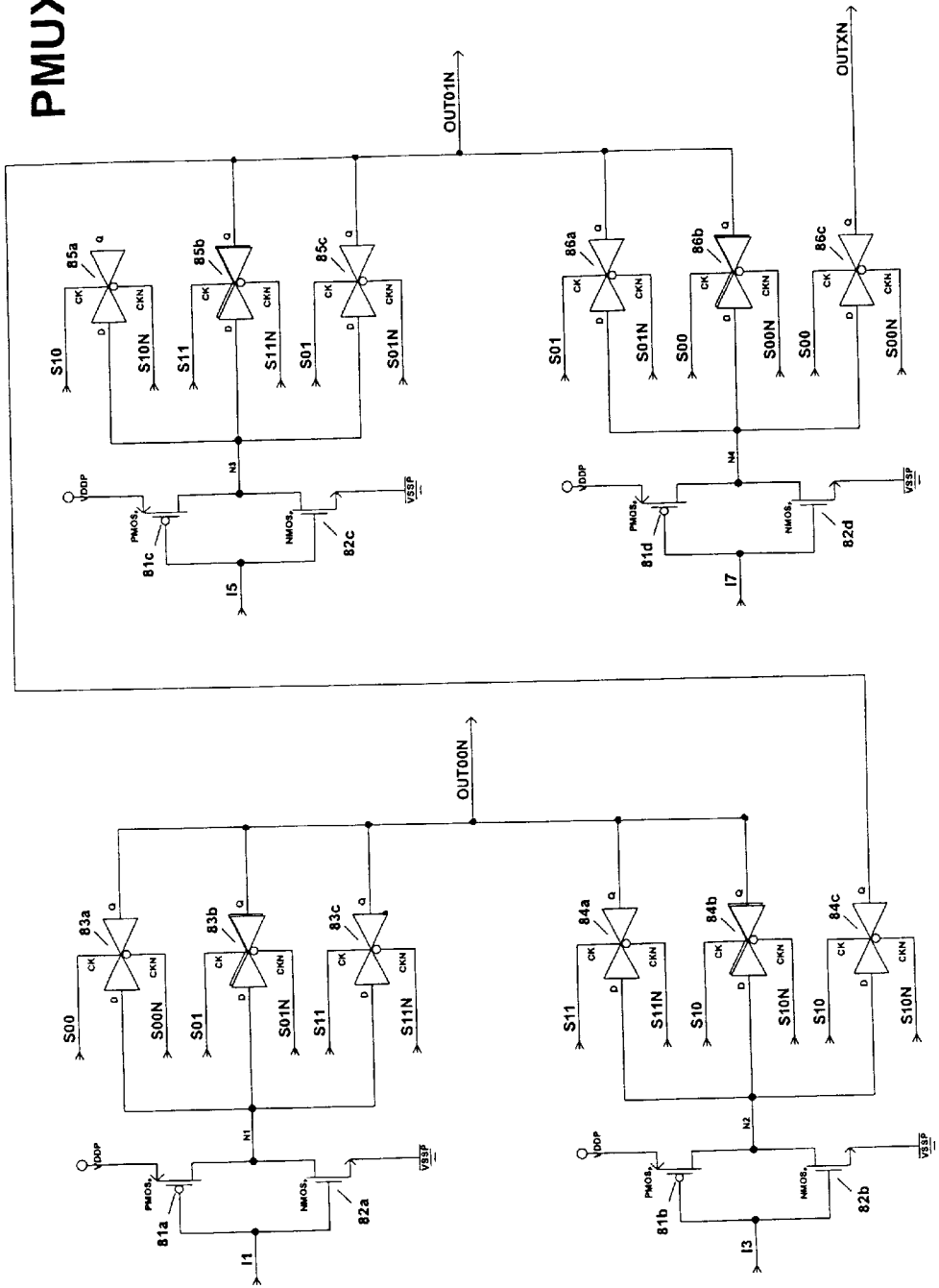
FIG. 31 is a schematic diagram of the CMOS implementation of a PMUX of the 16:8 PMUX of FIG. 30.

FIG. 31 shows a more detailed drawing one of the PMUXs 79*a*–79*d*. As shown, each PMUX includes four CMOS driver pairs 81*a*/82*a*, 81*b*/82*b*, 81*c*/82*c*, and 81*d*/82*d*, which amplify input signals I1, I3, I5, and I7, respectively. Switches 83*a*, 83*b*, 83*c*, 84*a*, and 84*b* are enabled by select signals S00/S00N, S01/S01N, S11/S11N, S11/S11N, and S00/S10N, respectively, and multiplexes I1 and I3 onto output node OUT00N. Switches 84*c*, 85*a*, 85*b*, 85*c*, 86*a*, and 86*b* are enabled by select signals S10/S10N, S10/S10N, S11/S11N, S01/S01N, S01/S01N, and S00/S00N, respectively, and multiplexes I3, I5, and I7 onto output node OUT01N. Finally, switch 86*c* is enabled by input signal S00/S00N and selectively drives input signal I7 onto output node OUTXN. FIG. 34 shows the select logic of the PMUX of FIG. 31

Figure 32:
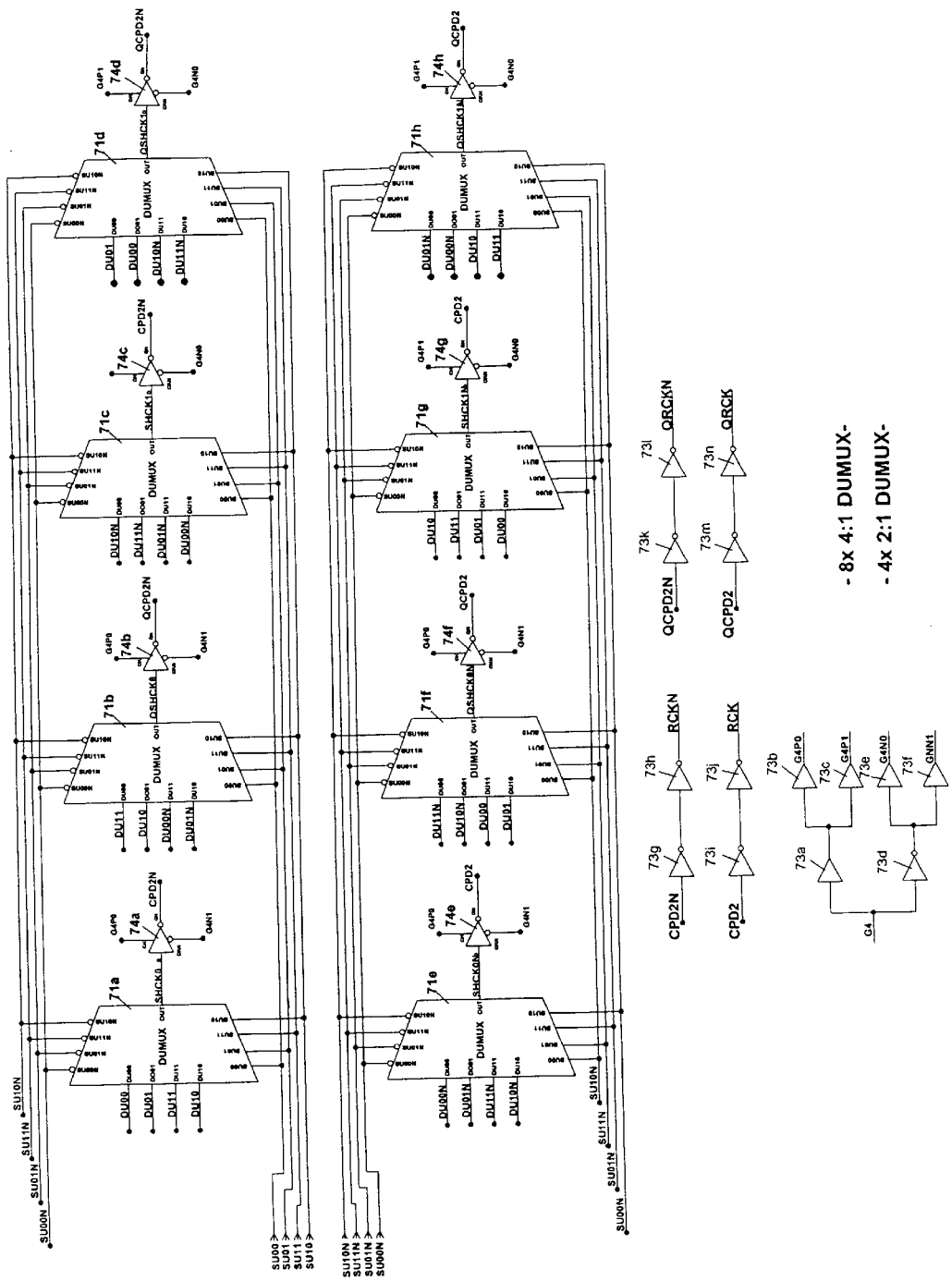
FIG. 32 is a block diagram of the 8×4:1 DMUX and the 4×2:1 DMUX of the interpolating phase multiplexor of FIG. 29.

FIG. 32 shows the eight DUMUXs 71*a*–71*h* of FIG. 29. As shown, each DMUX receives four clock signals from DU including clock signals (DU00/DU00N, DU01/DU01N. DU10/DU10N, and DU11/DU11N) and eight select signals SU including clock signals (SU00/SU00N, SU01/SU01N. SU10/SU10N, and SU11/SU11N). With respect to 4:1 DMUX 71*a*, select signals SU select one of input signals DU00, DU01, DU11, and DU10 to generate output signal SHCK0. With respect to 4:1 DMUX 71*b*, select signals SU select one of input signals DU11, DU10, DU00N, and DU01N to generate output signal QSHCK0. With respect to 4:1 DMUX 71*c*, select signals SU select one of input signals DU10N, DU11N, DU01N, and DU00N to generate output signal SHCK1. With respect to 4:1 DMUX 71*d*, select signals SU select one of input signals DU01, DU00, DU10N, and DU11N to generate output signal QSHCK1.

With respect to 4:1 DMUX 71*e*, select signals SU select one of input signals DU00N, DU01N, DU11N, and DU10N to generate output signal SHCK0N. With respect to 4:1 DMUX 71*f*, select signals SU select one of input signals DU11N, DU10N, DU00, and DU01 to generate output signal QSHCK0N. With respect to 4:1 DMUX 71*g*, select signals SU select one of input signals DU10, DU11, DU01, and DU00 to generate output signal SHCK1N. With respect to 4:1 DMUX 71*h*, select signals SU select one of input signals DU01N, DU00N, DU10, and DU11 to generate output signal QSHCK1N. FIG. 35 shows a table describing the select logic of the DUMUX of FIG. 32.

Figure 33:
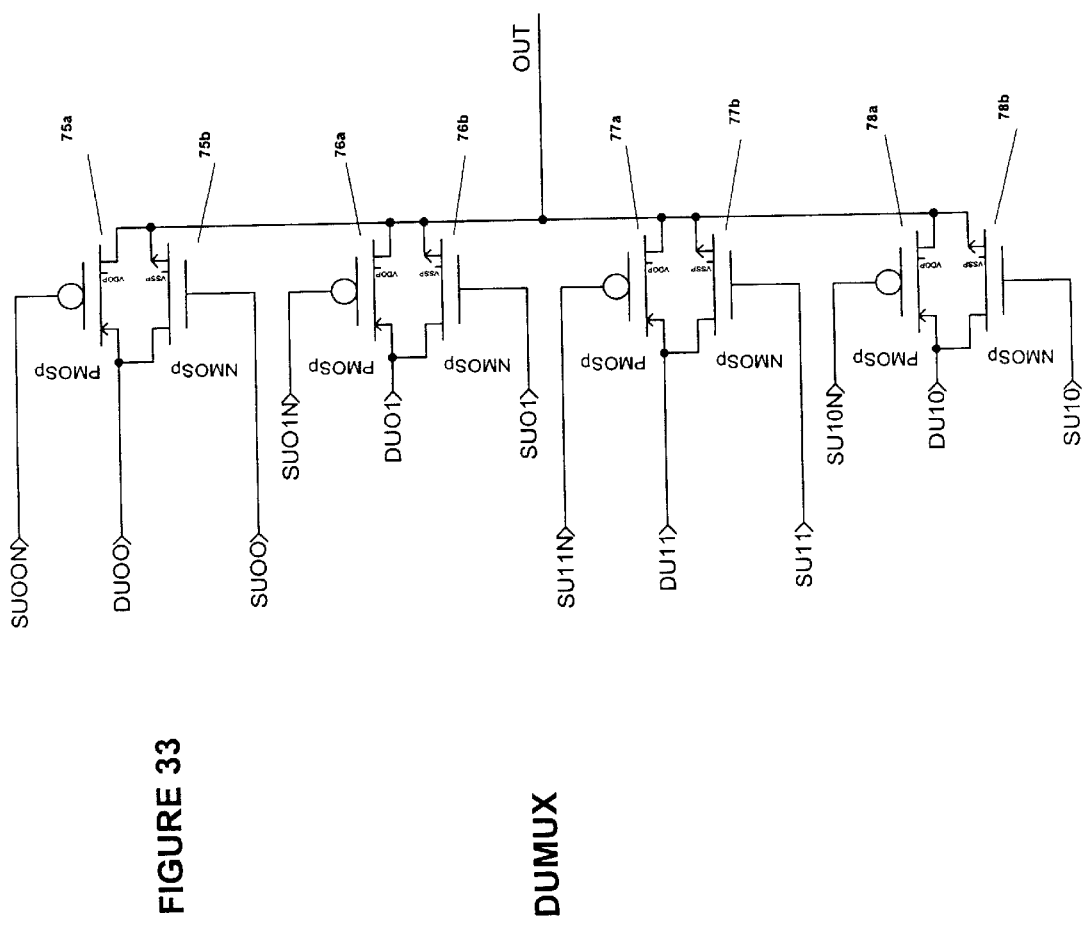
FIG. 33 is a detailed schematic diagram of the CMOS implementation of one of the 4:1 DMUXs of FIG. 32.

FIG. 33 shows a detailed circuit diagram of the 4:1 DUMUX of FIG. 29. DUMUXs 71*a*–71*h* include four switch pairs 75*a*/75*b*, 76*a*/76*b*, 77*a*/77*b*, and 78*a*/78*b*. The four switches receive input clocks DU00, DU01, DU11, and DU10, respectively, and are controlled by input select signals SU00/SU00N, SU01/SU01N, SU11/SU11N, and SU10/SU10N, respectively. The outputs of the four switches are coupled to output node OUT.

Operation of the Interpolating Phase Multiplexor

Operation of the multi-channel clock recovery circuit is similar to the first embodiment (inverting phase multiplexor), except that the phase multiplexor receives 16 phases of the reference clock which are spaced equally over one half-speed clock cycle period T, and an additional 16 phases are obtained by interpolating between the 16 equally space clock signals. FIG. 32 shows the output of the multi-phase clock generation circuit of FIG. 3 having 16 phase of half-speed clocks equally spaced within on half-speed clock cycle period T. Based on interpolation between adjacent phases, any of 32 phases of reference clocks can be selected.

With reference to FIG. 29, the interpolating phase multiplexor receives the 16 clock signals PH<15:0>. Based on select signals S, the 16:8 PMUX 70 selects four clocks from the 16 clock signals PH<15:0>. The four selected clock signals have a relative phase relationship of 0°, 90°, 180°, and 270°. Based on select signals S, the 16:8 PMUX 70 generates four interpolated clocks from the 16 clock signals from PH<15:0>. The four selected interpolated clocks have a relative phase relationship of 0°, 90°, 180°, and 270°. The DUMUX places the 8 selected and interpolated clocks onto selected DUMUX outputs so as to generate four equally spaced half-speed clocks RCK, RCKN, QRCK, and QRCKN.

Figure 37:
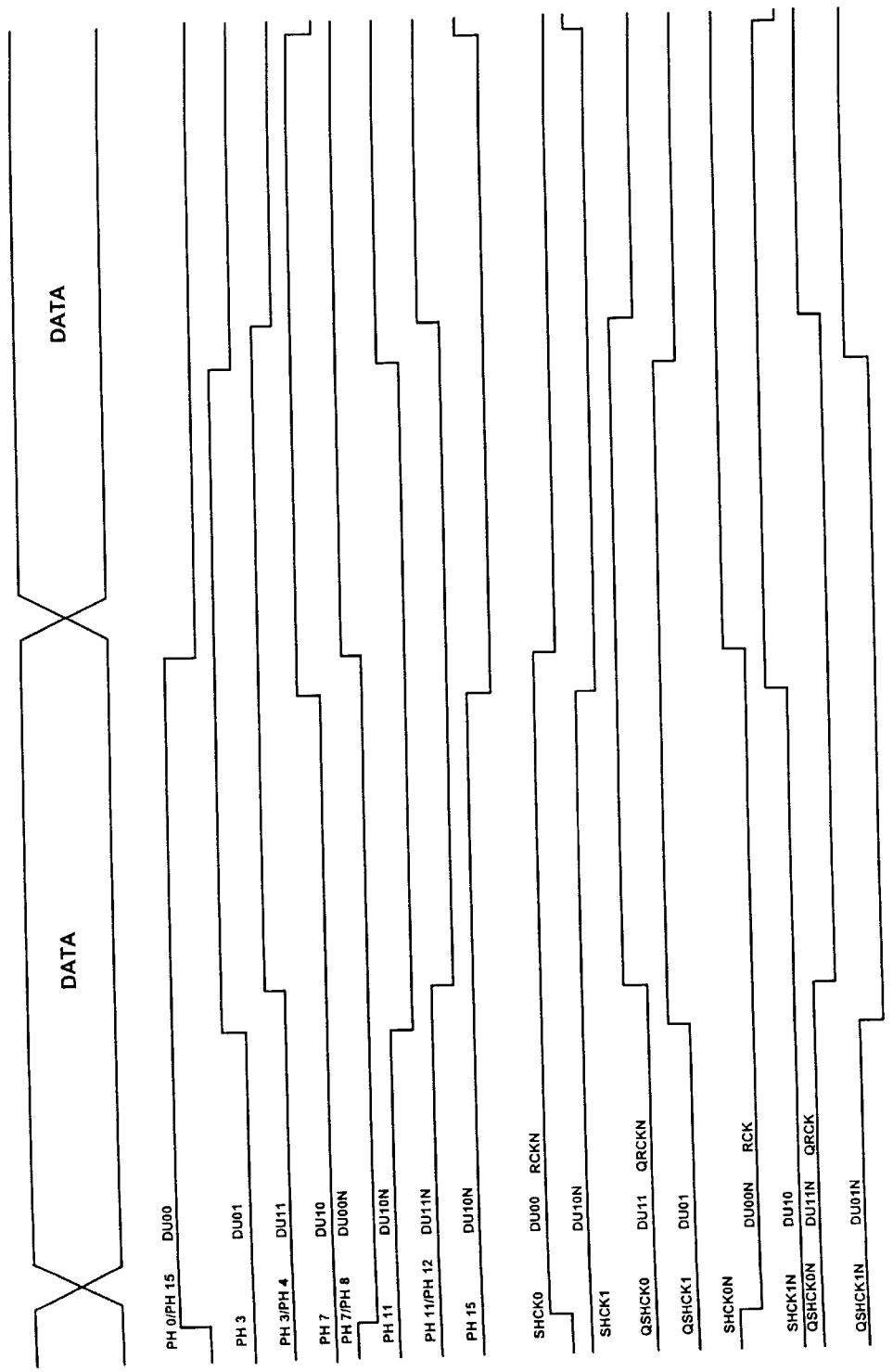
FIG. 37 is an exemplary timing diagram showing the process of the selection of clocks by the interpolating phase multiplexor of FIG. 29.
Figure 38:
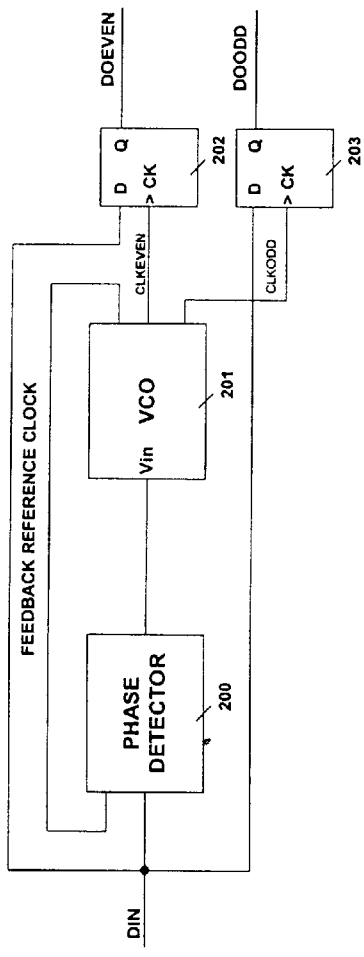
FIG. 38 is a prior art clock recovery circuit.
Figure 39:
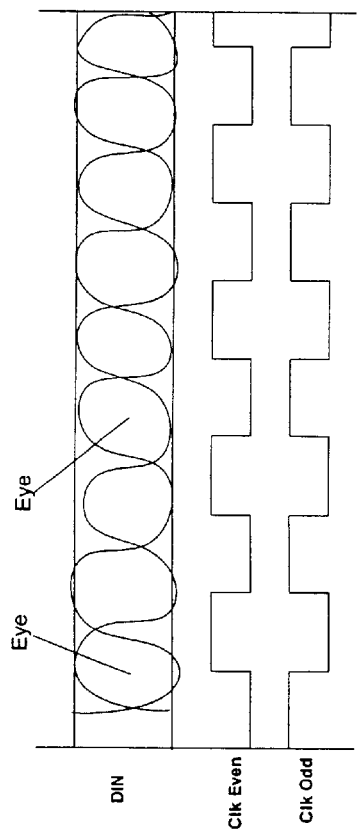
FIG. 39 is a timing diagram of the prior art clock recovery circuit of FIG. 38.

An exemplary timing diagram of one such selection is shown in FIG. 37. Select control signal S is based on gray code bits G0=0 and G1=0. Based upon select signals, PMUX 70 chooses clock phases PH<3, 7, 11, and 15> and generates interpolated clock phases PH<0/15, 3/4, 7/8, and 11/12> labeled DU00/DU00N, DU01/DU01N, DU10/DU10N, and DU11/DU11N, respectively. Thus, as shown the selected clocks each have a 0°, 90°, 180°, and 270° phase relation-ship and the interpolated clocks have a 0°, 90°, 180°, and 270° phase relationship. Moreover, the selected and interpolated clock sets differ in phase by 11.25°, i.e., 360/32, phase resolution of the clock recovery current.

Figure 36:
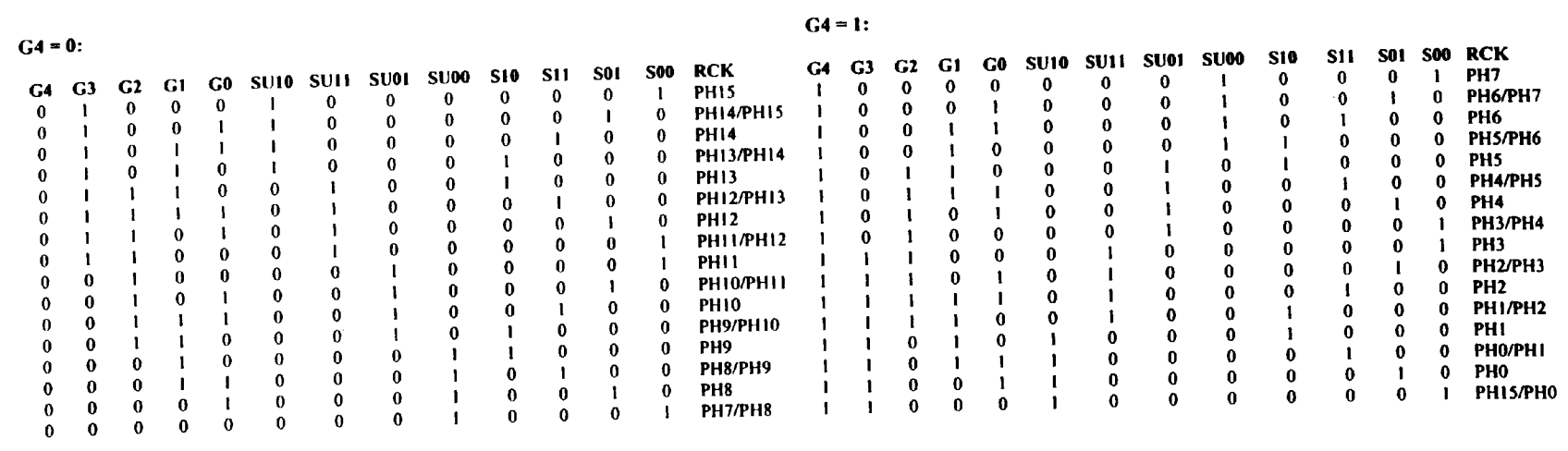

With reference to the exemplary timing diagram of FIG. 37, an example of a secondary selection is shown. Control signals SU are based on gray code bits G2 and G3 and determine a secondary selection of half-speed clocks DU00/DU00N, DU01/DU01N, DU10/DU10N, and DU11/DU11N. Based on select signals SU, these eight phases are received by DMUXs 71*a*–71*h* and placed on outputs SHCK0, SHCK1, SHCK0N, SHCK1N, QSHCK0, QSHCK1, QSHCK0N, and QSHCK1N. Accordingly, gray code bits G2=0 and G3=0, the multiplexor assigns DU00 to SHCK0, DU10N to SHCK1, DU00N to SHCK0N, DU10 to SHCK1N, DU11 to QSHCK0, DU01 to QSHCK1, and DU11n=N to QSHCK0N. Finally, based on select signal G4, a selection among signal pairs SHCK0/SHCK1, SHCK0N/SHCK1N, QSHCK0/QSHCK1, and QSHCK0N/QSHCK1N is made by 2:1 multiplexors 72*a*–72*d*. The 2:1 multiplexors choose between the selected and the interpolated clock sets to produce four half-speed clock signals RCK, RCKN, QRCK, and QRCKN, equally spaced within one half-speed clock cycle period T. The table shown in FIG. 36 shows the manner in which the gray code selects any combination of quadrature phased clock signals based on the actual clock signals or based on the interpolated clock signals.

The interpolating phase multiplexor offers significant advantages in power consumption. First, because only 16 of the 32 possible clock phases are carried via a bus 13 from the multi-phase clock generator, less power is constumed as compared to a 32 bit wide clock bus. Second, the interpolation allows the use of a multi-phase clock generator having a significantly lower phase resolution requirement and fewer stages. Therefore, the total number of devices required is reduced. Further, this design used lower power and provides for a more easily realizable clock generator.

Additionally, the inverting phase mixer and interpolating phase mixer can be combined in any number of ways to achieve even further advantages. For example, 16 of the clock phases can be generated from only 8 clock phases of a full half-speed clock cycle period, and then additional resolution can be achieved by interpolating between the adjacent 16 clock phases. This results in a total of 32 clock phases from the original 8 clock phases. By way of further example, 16 clock phases can be generated via interpolation between 8 phases of clock signals from ½ of a half-speed clock cycle period, and then the clock signals for the other ½ cycle can be generated by inverting these 16 signals. Therefore, the same amount of phase information can be carried on a much smaller phase bus.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A digital clock recovery circuit, comprising:
   means for generating half-speed quadrature clocks operating at a half speed of an incoming data rate of a data channel, wherein a first pair of the half-speed quadrature clocks having an inverse phase relationship register input data of the data channel at a center of an eye of the input data, and wherein a second pair of the half-speed quadrature clocks having an inverse phase relationship and a phase difference of 90° and 270° relative to the first pair of half-speed quadrature clocks, respectively, have transitions occurring in a middle of transition regions of the input data eye, wherein the phases of the half-speed quadrature clocks span two data eyes of the input data, and wherein in a given half-speed recovered clock cycle there could be as many as two transitions of the input data; and means for synchronizing the half-speed quadrature clocks and the input data of the data channel, the means for synchronizing comprising:

means for analyzing a position of each of the data transitions of the input data relative to each of the four phases of the half-speed quadrature clocks; and means for comparing a first sum of transitions of the input data occurring between quadrature phases to a second sum of transitions of the input data occurring between quadrature phases, wherein a comparison result is indicative of a relative phase difference between the half-speed quadrature clocks and the input data, and is used to maintain synchronization between the half-speed quadrature clocks and the input data of the data channel.

2. The digital clock recovery circuit according to claim 1, wherein the means for generating half-speed quadrature clocks further comprises:

a phase multiplexor means for selecting the four half-speed quadrature clocks from a plurality of phases of half-speed clocks, the half-speed clocks being generated by a VCO of an analog PLL, wherein the comparison result controls the phase multiplexor so as to cause the first and second sums to be equal.

3. The digital clock recovery circuit according to claim 2, further comprising:

a digitally programmable filter means for filtering the comparison result and for providing a filtered comparison result to the phase multiplexor means, wherein a desired performance for the channel is selected by programming the digitally programmable filter.

4. A digital clock recovery method, comprising the steps of:

generating half-speed quadrature clocks operating at half speed of an incoming data rate of a data channel, wherein a first pair of the half-speed quadrature clocks having an inverse phase relationship are capable of registering input data of the data channel at a center of an eye of the input data, and wherein a second pair of the half-speed quadrature clocks having an inverse phase relationship and a phase difference of 90° and 270° relative to the first pair of half-speed quadrature clocks, respectively, have transitions occurring in a middle of transition regions of the input data eye, wherein the phases of the half-speed quadrature clocks span two data eyes of the input data, and wherein in a given half-speed recovered clock cycle there can be as many as two transitions of the input data; and synchronizing the half-speed quadrature clocks and the input data of the data channel, the synchronization step further comprising the steps of:

analyzing a position of each of the data transitions of the input data relative to each of the four phases of the half-speed quadrature clocks, and comparing a first sum of transitions of the input data occurring between quadrature phases to a second sum of transitions of the input data occurring between quadrature phases, wherein a comparison result is indicative of the relative phase between the half-speed quadrature clocks and the input data.

5. The digital clock recovery method according to claim 4, wherein the step for generating half-speed quadrature clocks further comprises the step of:

selecting the four half-speed quadrature clocks from a plurality of phases of half-speed clocks, the half-speed clocks generated by a VCO of an analog PLL, wherein the selection is based on the comparison result, and wherein the selected half-speed quadrature clocks cause the first and second sums to be equal.

6. The digital clock recovery method according to claim 5 further comprising the step of:

digitally filtering the comparison result with a digitally programmable filter, wherein a desired performance of the channel is selected by programming the digitally programmable filter.

7. A multiple channel clock recovery circuit for generating half-speed quadrature clocks from input data of each of the multiple channels, the multiple channel clock recovery circuit comprising:

a voltage controlled oscillator outputting a plurality of half-speed reference clocks having a half-speed frequency relative to the input data; and a plurality of clock recovery circuits, each of the plurality of clock recovery circuits including a phase locked loop circuit receiving the input data of one of the multiple channels and having a phase multiplexor, the phase multiplexor receiving the plurality of half-speed reference clocks and being controlled to output the four half-speed quadrature clocks having relative phases of 0°, 90°, 180°, and 270° relative to the eye of the input data, wherein the four half-speed recovered clocks are used by the phase locked loop as feedback reference clocks, and wherein the phase locked loop comprises:

a digital phase detector receiving the input data and the half-speed quadrature clocks, the digital phase detector comparing the phase of the input data to the phase of the half-speed quadrature clocks and generating an error signal indicating a difference in phase between the phase of the input data and the phase of the half-speed quadrature clocks;

a digital filter receiving and filtering the error signal to generate a filtered error signal; and a phase store having a phase counter for storing a current phase and having output logic for generating a plurality of control signals, the plurality of control signals corresponding to the current phase and controlling the phase multiplexor to select the four half-speed quadrature clocks corresponding to the current phase, the filtered error signal causing the phase counter to increment when the half-speed quadrature clocks lag the phase of the input data and decrement when the half-speed quadrature clocks lead the phase of the input data.

8. The multi-channel clock recovery circuit according to claim 7, wherein the voltage controlled oscillator outputs N half-speed reference clocks having rising transitions equally spaced in time within one half of a half-speed reference clock cycle period T; and the phase multiplexor inverts two of the N half-speed reference clocks to generate two of the four half-speed quadrature clocks so that the four half-speed quadrature clocks are selected from a possible N half-speed reference clocks and N inverted half-speed reference clocks.

9. The multi-channel clock recovery circuit according to claim 7, wherein
the voltage controlled oscillator outputs N half-speed reference clocks having rising transitions equally spaced in time within one half of a half-speed reference clock cycle period T; and
the phase multiplexor selects four of the N half-speed reference clocks and inverts the selected four of the N half-speed reference clocks to generate a total of eight half-speed reference clocks having rising transitions equally spaced within one half-speed clock cycle period T, wherein the phase multiplexor selects two of the four half-speed quadrature clocks having phases of 0° and 90° from the eight half-speed reference clocks, and generates the other two of the four half-speed quadrature clocks having phases of 180° and 270° by inverting the two half-speed quadrature clocks having phase of 0° and 90°.

10. The multi-channel clock recovery circuit according to claim 7, wherein
the voltage controlled oscillator outputs N half-speed reference clocks having rising transitions equally spaced in time within a half-speed reference clock cycle period T; and
the phase multiplexor interpolates between adjacent half-speed reference clocks to generate two interpolated half-speed reference clocks, wherein the phase multiplexor selects from a possible N reference half-speed clocks and N interpolated half-speed clocks to generate the four half-speed quadrature clocks.

11. The multi-channel clock recovery circuit according to claim 7, wherein
the voltage controlled oscillator outputs N half-speed reference clocks having rising transitions equally spaced in time within a half-speed reference clock cycle period T; and
the phase multiplexor selects four of the N half-speed reference clocks and interpolates between the four of the selected half-speed reference clocks and four adjacent half-speed reference clocks to generate four interpolated half-speed reference clocks, wherein the phase multiplexor selects from the group of four selected half-speed reference clocks or the group of four interpolated half-speed reference clocks to generate the four half-speed quadrature clocks.

12. The multi-channel clock recovery circuit according to claim 7, wherein the digital phase detector comprises:
a plurality of registered delay lines being driven by the four half-speed quadrature clocks and being tapped to sample values of the input data over two bits of the input data; and
combinational logic that determines the number and direction of input data transitions observed over the two input data bits based on the sampled values of the input data, the number and direction of the net transitions indicating magnitude and direction of the phase error between the input data and the four half-speed quadrature clocks.

13. The multi-channel clock recovery circuit according to claim 7, wherein the input data is half-speed data having the same speed as the half-speed quadrature clocks, and wherein the digital phase detector comprises:
a plurality of registered delay lines being driven by two of the four half-speed quadrature clocks having a relative phase difference of 180° and being tapped to sample values of each bit of the half-speed input data; and
combinational logic that determines the number and direction of input data transitions observed, if any, over every bit of the input data based on the sampled values of the input data, the number and direction of the net transitions indicating magnitude and direction of the phase error between the input data and the two of the half-speed quadrature clocks.

14. The multi-channel clock recovery circuit according to claim 7, wherein the digital filter comprises:
a first lowpass filter receiving the phase error signal, lowpass filtering the phase error signal, and generating an output; and
a second lowpass filter receiving the output of the first lowpass filter, lowpass filtering the output of the first lowpass filter, and generating an output, wherein the second lowpass filter has programmable coefficients to select filter characteristics the second lowpass filter.

15. The multi-channel clock recovery circuit according to claim 7 wherein the digital filter comprises:
a fast lowpass filter receiving the error signal indicative of a magnitude and direction that a phase of the half-speed quadrature clocks is required to be adjusted to be in-phase with the input data, the first lowpass filter including a fast up/down counter having a count and being incremented by the magnitude of the error signal when the error signal is positive and decremented by the magnitude of the error signal when the error signal is negative, the fast up/down counter generating an overflow signal when the count of the fast up/down counter equals a first maximum positive count and generating a second overflow signal when the count of the fast up/down counter equals a first maximum negative count; and
a slow lowpass filter receiving the first and second overflow signals from the fast lowpass filter, the slow lowpass filter including a slow up/down counter having a count and being incremented by the first overflow signal and decremented by the second overflow signal, the slow up/down counter generating a phase-up signal when the count of the slow up/down counter equals a second maximum positive count and generating a phase-down signal when the count of the slow up/down filter equals a second maximum negative count, wherein the phase-up signal increments the phase store counter and the phase-down signal decrements the phase store counter.

16. The two stage digital filter according to claim 15, wherein the slow up/down counter further comprises:
a comparator having a first input receiving the count of the slow up/down counter and a second input for receiving a preselected digital coefficient, the preselected digital coefficient defining the value of the second maximum positive and negative count, wherein the comparator generates the phase-up signal when the count of the slow up/down counter reaches the value of the preselected digital coefficient and generates the phase-down signal when the count of the slow up/down counter reaches a negative value of the preselected digital coefficient.

17. The two stage digital filter according to claim 15, wherein the fast up/down counter is an N bit counter, where (N/2)−1 represents the first maximum positive count and 1−(N/2) represents the first maximum negative count.

18. The two stage digital filter according to claim 15 wherein the slow up/down counter is reset to a count midway between the second maximum positive count and the second maximum negative count when one of a phase-up and phase-down signal is generated.

19. The multi-channel clock recovery circuit according to claim 17, wherein the output logic of the digital phase store comprises:
- a gray code converter having an input coupled to the output of the phase counter so that when the phase counter increments or decrements by one the gray code converter generates gray code output words having a plurality of bits, wherein only one of the plurality of bits changes states for each increment or decrement of the phase counter; and
- a control signal generator having an output coupled to a phase select input of the phase multiplexor and an input coupled to the output of the gray code converter.

20. The multi-channel clock recovery circuit according to claim 17, wherein the control signal generator outputs the plurality of control signals each corresponding to a clock phase, wherein the deassertion of one of the plurality select signals corresponding to a deselected clock phase of the phase multiplexor is delayed with respect to the assertion of another of the plurality of select signals corresponding to a selected clock phase of the phase multiplexor so that the connection of the selected clock path between a selected input and output of the phase multiplexeor is made before the connection of the deselected clock path between a deselected input and output of the phase multiplexor is broken.

* * * * *